(12) United States Patent
Labanowski et al.

(10) Patent No.: US 11,762,045 B2
(45) Date of Patent: Sep. 19, 2023

(54) SYSTEM FOR A MULTIPLEXED MAGNETIC SENSOR ARRAY CIRCUIT

(71) Applicant: Sonera Magentics, Inc., Berkeley, CA (US)

(72) Inventors: Dominic Labanowski, Berkeley, CA (US); Nishita Deka, Berkeley, CA (US)

(73) Assignee: Sonera Magnetics, Inc., Berkeley, CA (US)

( * ) Notice: Subject to any disclaimer, the term of this patent is extended or adjusted under 35 U.S.C. 154(b) by 0 days.

(21) Appl. No.: 17/489,978

(22) Filed: Sep. 30, 2021

(65) Prior Publication Data
US 2022/0099763 A1 Mar. 31, 2022

Related U.S. Application Data

(60) Provisional application No. 63/085,467, filed on Sep. 30, 2020.

(51) Int. Cl.
*G01R 33/24* (2006.01)
(52) U.S. Cl.
CPC ................................. *G01R 33/24* (2013.01)
(58) Field of Classification Search
CPC ......... G01R 33/24; G01R 33/60; G01N 24/10
See application file for complete search history.

(56) References Cited

U.S. PATENT DOCUMENTS

| | | |
|---|---|---|
| 4,078,186 A | 3/1978 | Folen et al. |
| 4,951,674 A | 8/1990 | Zanakis et al. |
| 6,046,657 A | 4/2000 | Alers et al. |
| 6,279,406 B1 | 8/2001 | Li et al. |
| 6,590,751 B1 | 7/2003 | Horng et al. |
| 7,053,730 B2 | 5/2006 | Park et al. |
| 7,560,920 B1 * | 7/2009 | Ouyang ................. G01R 33/10 |
| | | 324/242 |
| 7,696,748 B2 * | 4/2010 | Schlicker ........... G01N 27/9046 |
| | | 324/202 |
| 9,099,984 B2 | 8/2015 | Reinhardt et al. |

(Continued)

FOREIGN PATENT DOCUMENTS

| | | |
|---|---|---|
| CN | 101064014 A | 10/2007 |
| WO | 2018111769 A1 | 6/2018 |

OTHER PUBLICATIONS

U.S. Appl. No. 17/161,385, filed Jan. 28, 2021, Nishita Deka.

(Continued)

*Primary Examiner* — Jay Patidar
(74) *Attorney, Agent, or Firm* — Alpine Patents LLC; Brian Van Osdol

(57) ABSTRACT

Systems and method for a multi-array magnetic sensing component, which can include a circuit base platform; a set of magnetic sensors arranged on the circuit base platform; and a circuit system comprising intermediary circuit components, signal input, and a signal output, the signal input being an electrical oscillator signal input and being directable to each magnetic sensor in the set of magnetic sensors, the signal output including magnetic field measurements from the set of magnetic sensors, wherein each magnetic field measurement is individually selectable, the circuit system being configured to turn on or off subsets of the set of magnetic sensors, and the intermediary circuit components including a mixer.

19 Claims, 41 Drawing Sheets

(56) References Cited

U.S. PATENT DOCUMENTS

| | | |
|---|---|---|
| 10,601,400 B1 | 3/2020 | McConney et al. |
| 2007/0167723 A1 | 7/2007 | Park et al. |
| 2007/0252593 A1 | 11/2007 | Takeuchi et al. |
| 2010/0164487 A1 | 7/2010 | Eyckmans et al. |
| 2010/0253326 A1 | 10/2010 | Koyilothu et al. |
| 2012/0218060 A1 | 8/2012 | Burak et al. |
| 2012/0256522 A1 | 10/2012 | Ito et al. |
| 2012/0280682 A1 | 11/2012 | Cheng et al. |
| 2013/0165766 A1 | 6/2013 | Nishikawa et al. |
| 2013/0271145 A1 | 10/2013 | Hwang et al. |
| 2013/0324832 A1 | 12/2013 | Wu et al. |
| 2014/0139213 A1 | 5/2014 | Cadugan et al. |
| 2015/0318838 A1 | 11/2015 | Bhattacharjee et al. |
| 2016/0143541 A1 | 5/2016 | He et al. |
| 2017/0086681 A1 | 3/2017 | Passmore |
| 2017/0363584 A1 | 12/2017 | Tong et al. |
| 2018/0081001 A1 | 3/2018 | Iwasaki et al. |
| 2018/0292468 A1 | 10/2018 | Guo |
| 2019/0317161 A1 | 10/2019 | Quandt et al. |
| 2019/0325904 A1 | 10/2019 | Ramakrishnan |
| 2019/0385586 A1 | 12/2019 | Salahuddin et al. |
| 2020/0072916 A1 | 3/2020 | Alford et al. |
| 2020/0334559 A1 | 10/2020 | Anderson et al. |
| 2020/0348378 A1 | 11/2020 | Alford et al. |
| 2021/0041512 A1 | 2/2021 | Pratt et al. |
| 2021/0181132 A1 | 6/2021 | Labanowski et al. |

OTHER PUBLICATIONS

Huang Liang et al: "Theoretical investigation of magnetoelectric surface acoustic wave characteristics of ZnO/Metglas layered composite", AIP Advances, American Institute of Physics, 2 Huntington Quadrangle, Melville, NY 11747, vol. 6, No. 1, Jan. 8, 2016 (Jan. 8, 2016), XP012203752, DOI: 10.1063/1.4939846 [retrieved on Jan. 1, 1901] *sections I. and IV.; figure 1*.

L. Dreher et al: "Surface acoustic wave driven ferromagnetic resonance in nickel thin films: Theory and experiment", Physical Review. B, vol. 86, No. 13, Oct. 17, 2012 (Oct. 17, 2012), XP055635289, US ISSN: 1098-0121, DOI: 10.1103/PhysRevB.86. 134415 *Sections I. to III.; figure 1*.

Labanowski and Salahuddin, "Effects of Magnetoelastic film thickness on power absorption in acoustically driven ferromagnetic resonance," App Phys. Lett. 111, 102904 (2017); doi: 10.1063/1. 4994933.

Labanowski et al., "Power absorption in acoustically driven ferromagnetic resonance", Appl. Phys. Lett. 108, 022905 (2016).

Labanowski, "Power Absorption in Acoustically Driven Ferromagnetic Resonance", Supplemental Material, 4 pages, 2016.

Shibayama et al, "Optimum Cut for Rotated Y-Cut LiNbO3 Crystal Used as the Substrate of Acoustic-Surface-Wave Filters", Proc. of the IEEE, vol. 64, No. 5, p. 595-598, (Year: May 1976).

\* cited by examiner

| | | | |
|---|---|---|---|
| S | Sensor |  | Coupler |
| ℓ | Attenuator |  | Hybrid Coupler |
| L | Inductor | M | Matching Network |
| γ | Phase shifter |  | Field Coil |
| F | Bandpass Filter | ≥ | Comparator |
| X | Mixer | Logic | Logic Circuit |
| A | Amplifier | | |

Generating an electrical signal S110

Splitting the current into a test signal and a reference signal S120

Applying the EM field to the test signal S130

Measuring the EM field S140

FIGURE 32

SYSTEM FOR A MULTIPLEXED MAGNETIC SENSOR ARRAY CIRCUIT

CROSS-REFERENCE TO RELATED APPLICATIONS

This application claims the benefit of U.S. Provisional Application No. 63/085,467, filed on 30 Sep. 2020, which is incorporated in its entirety by this reference.

TECHNICAL FIELD

This invention relates generally to the field of magnetic sensors, particularly magnetic sensors based on ferromagnetic resonance, and more specifically to a new and useful system and method for a magnetic sensor array circuit.

BACKGROUND

Ferromagnetic resonance (FMR) may be used to measure magnetic properties of materials by detecting the precessional motion of the magnetization in a ferromagnetic sample. Different types of FMR include externally-driven FMR and current-driven FMR. FMR can be excited using a variety of techniques, like cavity excitation, stripline excitation, spin transfer torque, and spin orbit torque, among others. These implementations are typically not compatible with device applications. They require large cavities, high power drive, and use large sample volumes in order to be effective. As such, the use of FMR is largely restricted to large laboratory setups and to research projects.

There are several types of highly sensitive magnetic sensors but they all have various limitations. For example, SERF (Spin Exchange Relaxation Free) and SQUID (Superconducting Quantum Interference Device) magnetic sensing approaches can have high sensitivity but at the cost of being large, complex and difficult for system integration. These sensors require room-size integrations that require heavy shielding to isolate the sensors from ambient and other external fields and strictly maintained temperature conditions for functionality. Alternatively, Hall effect sensors and magnetoresistive sensors may be smaller solutions at the cost of sensitivity and are largely not sufficient for many purposes such as in brain activity monitoring devices.

FMR sensor devices have demonstrated potentially great versatility over other magnetic sensors. To further increase ease and implementation of FMR sensor devices there is a need of an invention that enables flexible and simpler implementation of the FMR sensors. Thus, there is a need in the field of FMR sensors a new and useful system and method for a FMR multi-sensor circuit that is small, portable, and easily modifiable for many applications. This invention provides such a new and useful system and method.

BRIEF DESCRIPTION OF THE FIGURES

FIG. 32 is a flowchart of a method of a preferred embodiment.

DESCRIPTION OF THE EMBODIMENTS

The following description of the embodiments of the invention is not intended to limit the invention to these embodiments but rather to enable a person skilled in the art to make and use this invention.

1. Overview

Figure 1:
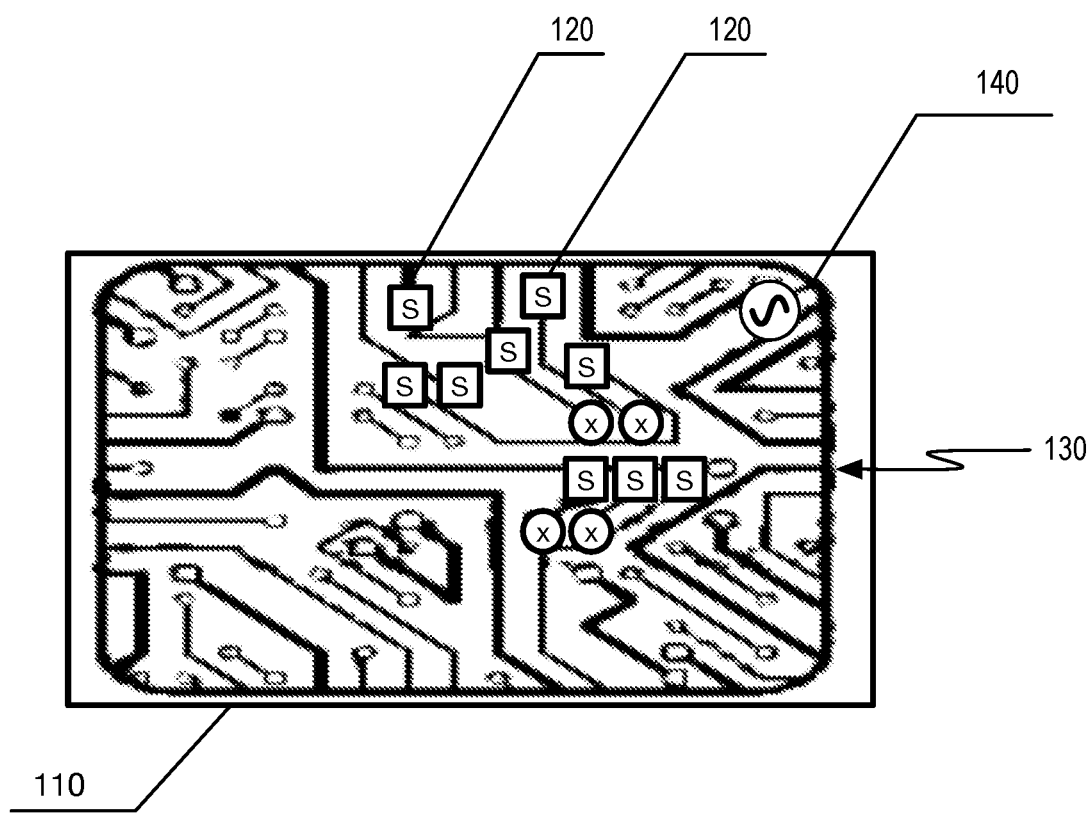
FIG. 1 is a schematic representation of an example system.
Figure 2:
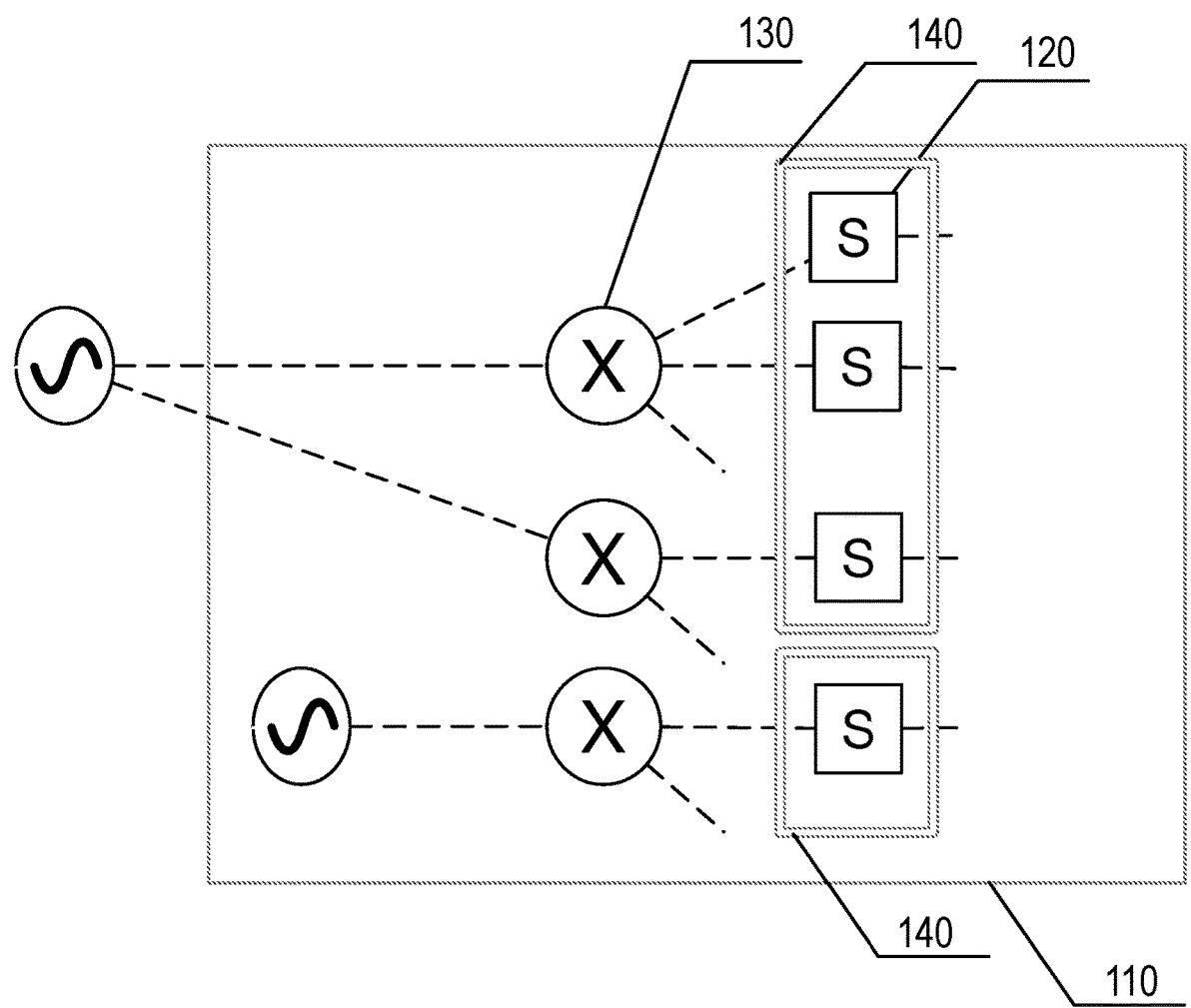
FIG. 2 is a high-level schematic representation of the system.

As shown in FIGS. 1 and 2, a system and method for a magnetic sensor array circuit includes: a circuit base platform; and set of sensors, comprising a plurality of magnetic sensors integrated into a circuit system. In preferred variations the magnetic sensors are ferromagnetic sensors, more preferably acoustically driven ferromagnetic resonance (ADFMR) multi-sensors. The system and method function as a field sensor, enabling the measurement of electromagnetic field properties (e.g., field strength, field direction, field gradient, field fluctuations, etc.). In particular, the system and method can enable magnetic sensor array that is packaged within a usable electronic format for system integration. The sensor array circuit may be positioned to enable multidimensional measurement of field properties over some desired space. Herein, the system and method enable design solutions for enabling operational functionality of a device with an array of multiple magnetic sensors (e.g., ADFMR sensors) such as enabling sharing of circuit components through time and/or frequency domain multiplexing across magnetic sensors, active and/or passive noise shielding, switchable operational states for power conservation or sensing capabilities, and/or other design considerations.

Dependent on desired implementation, the system and method provide multiple system and method variations for field measurements, or for enabling other devices, via this system and method, to make field measurements. Different implementations of the system and method may target various types of field measurements, focus on accuracy, provide high spatial resolution, reduce noise, and lower power consumption.

A single or array ADFMR sensor unit may include: a piezoelectric substrate comprising the main body of the ADFMR sensor component; an input interdigitated transducer (IDT), that generates a surface acoustic wave (SAW) from an electric signal using the piezoelectric effect which propagates along the substrate; a ferromagnetic film, along the substrate that enables absorption of magnetic fields by the SAW as it propagates thereby modifying the SAW; and an output IDT, that converts the modified SAW to an electric signal. This modified SAW may then be used to determine the strength of the magnetic field. As shown in FIGS. 3 and 6-14, dependent on implementation, the ADFMR sensor may have many variations that include one, or multi-sensing capabilities, i.e., multi-sensor unit.

As part of an ADFMR multi-sensor, the ADFMR sensors may be connected as parallel components, wherein dependent on variation, the ADFMR multi-sensor may have a single or multiple input and output IDTs, such that radio frequency (RF) signal from an electronic oscillator may be used to generate multiple input and/or output signals from a single ADFMR sensor, or multiple ADFMR sensors, which may be used to determine multi-dimensional, and spatial properties of EM fields.

In addition to the circuit system and the set of sensor device chips, the system and method may include additional components that may, or may not, be included in all implementations. The system and method may further include: a power generator, which is preferably an electronic oscillator that generates an RF signal over a desired bandwidth used as a signal input for driving one or more magnetic sensors; a frequency mixer, that combines electric signals both for processing and normalizing normalizes sensor output; and a processing system, that digitizes and extracts sensor data from output electric signals.

The system and method may further include other circuit and signal components such as: signal amplifiers, bandpass filters, attenuators, inductors, phase shifters, couplers, matching networks, analog to digital converters (ADC), digital to analog converters (DAC), and comparators. The system and method may further include other components as desired.

The system and method may provide a sensor array field sensor as a "component", which may be incorporated into other systems for field measurements. In this manner the system and method may provide a magnetic sensor array chip or electronic component package that can be incorporated into other devices. As a field measuring chip, the system and method may be incorporated as an application specific integration chip (ASIC) or as an application specific standard project (ASSP). Dependent on implementation, the system and method may provide a highly specialized or general field sensor array for a multitude of use cases. The system and method may be applied broadly to any field that requires measurement of EM fields. As the system and method provide highly robust and precise measurement of EM fields, and EM field properties, many use cases are viable.

The system and method may be implemented in many medical fields, such as nuclear medicine as part of human body visualization techniques (e.g., MRI, fMRI); medical monitoring tools (e.g., brain activity monitoring, heart and periphery muscle monitoring). In this manner, the system and method may be applied to more complex functionalities, such as sleep monitoring, emotion/brain activity monitoring, brain computer interfaces, and/or other applications.

The system and method may be applied to the fields of augmented reality/virtual reality, wherein the system and method may enable improvements to positioning tools, such as accelerometers, determining head positioning, camera positioning, and brain activity. The chip sized system may enable itself to be incorporated into wearables, such as AR glasses, VR headsets, smart watches, headphones, chest straps (e.g., heart monitors), and fitness trackers.

The system and method may be generally applicable to many "sensing" technologies, such as fNIR spectroscopy, lidar, impedance tomography, and other magnetic sensors.

Additionally, there are many potential benefits in that the ADFMR chip sensors may be built to include specialized components or enhanced functionalities not easily implementable in other sensor devices. Examples include: low power usage, noise cancellation, field strength optimization.

A dense array of sensors may enable complex field measurements over many desired shapes or positions. This in turn may enable both better precision and accuracy as compared to other measurement systems.

One potential benefit of a specialized ADFMR chip sensor is that it may include noise cancellation. An ADFMR chip sensor that includes noise cancellation may require significantly less noise shielding and noise cancellation from external fields (e.g., earth's magnetic field) for accurate readings.

Additionally, ADFMR chip sensors employed in a dense array, may also add to the potential benefit of significantly reducing the need for noise cancellation. The dense array of sensors may add a sufficient number of sensor readouts such that the noise may be removed from the sensor readings via signal processing techniques.

Another potential benefit of a specialized ADFMR chip sensor is less power usage. At the expense of some sensitivity, an ADFMR chip sensor may, in some variations, be designed to use significantly less power at least in certain periods of time. Lower power usage ADFMR chip sensors may lead to a benefit for a device that can be significantly more mobile and less power reliant. For example, when implemented in a device for epileptic seizure monitoring, the device may primarily be operated in a low power mode to monitor for a particular pattern, and when a spike in activity is detected, the device can transition to a higher resolution monitoring mode for capturing activity during the seizure event. For example, the device may be used to measure activity during a spike in activity indicating some event such as during an ictal period indicative of a seizure.

Current systems with equivalent sensitivity for measuring magnetic fields, typically have a small range over which they can measure magnetic fields and magnetic fluxes. Another potential benefit of the system is that ADFMR chip sensors may accurately measure fields and gradients over several orders of magnitude.

As another potential benefit, the system and method may enable more cost-effective sensing arrays. As part of a multi-sensor implementation, the system and method enable multiple sensors using a single expensive component (e.g., mixers), thereby lowering the cost per sensor. Sharing of components can not only bring down cost but can also help reduce component count which can result in smaller package sizes and potentially higher sensor array density. Additionally, the system and method may enable a wafer-scale manufacturable product, which can provide a more cost-effective product.

As a chip/circuit based multi-sensor array, the system and method provide multiple potential benefits. In some variations, the chip/circuit based multi-sensor array provides the potential benefit of a complete packaged sensor system. That is, the system and method may provide an integrated System-on-a-chip (SoC), such that all components are integrated on an integrated chip or package. This may enable incorporation of magnetic sensor array chips or packages within other system integrations. For example, the system and method enable a magnetic array sensor package that could be integrated into a medical device that include a plurality of such packages for multi-dimensional magnetic sensing across a wide area.

Another potential benefit is that the system may enable a sensor product in an extremely compact form. As a chip/circuit based multi-sensor array the system may contain on the order of 100s or 1000s of magnetic sensors within a single chip and/or circuit.

Another potential benefit of the chip/circuit based multi-sensor array is the benefit of a specialized implementation tool. That is, the chip-based sensor array may be an application specific integration circuit (ASIC) implementation, wherein the system is constructed and configured for a specific application implementation.

Another potential benefit of the chip/circuit based multi-sensor array is the benefit of a generalized implementation sensor tool. That is, the chip-based sensor array may be an application-specific standard project (ASSP) implementation, wherein the system is constructed to be generally incorporated into other systems. As part of the ASSP implementation, the system and method may enable simple incorporation into most devices using generalized/standardized connectivity. System components (e.g., groups of sensors) may be permanently, or indefinitely activated or deactivated as per desired specific implementation.

The system and method potentially provide the benefit of an extremely energy efficient magnetic sensor array. The system and method may enable circuit geometries that reduced power use for magnetic field detection. Additionally, the system and method may enable low power functionality for the entire sensor array, where in lieu of precise measurements only a fraction of sensors function simultaneously to reduce power consumption. Additionally, in some variations, the system and method may incorporate acoustically driven magnetic resonance (ADFMR) sensors, providing a sensor array that provides field measurements, where the accuracy of the sensor measurements does not scale with power consumption, as compared to other types of sensors.

2. System

As shown in FIGS. 1 and 2, for a multi-array magnetic sensing component includes: a circuit base platform 110; a set of magnetic sensors 120 arranged on the circuit base platform; and a circuit system 130 that is configured to turn on or off subsets of the set of magnetic sensors and wherein the circuit system includes intermediary circuit components, a signal input, and a signal output, and The signal input is an electrical oscillator signal input that can be directable to each magnetic sensor in the set of magnetic sensors. The signal output comprises the electrical signal downstream of the set of magnetic sensors and can be individually selectable for output from one or more of the set of magnetic sensors (e.g., a distinct electric signal corresponding to one or a subset of magnetic sensors or extractable from an output signal resulting from a combination of outputs from the magnetic sensors). Additionally, the signal output includes magnetic field measurements from the set of magnetic sensors. Intermediary circuit components comprise circuitry components that the signal input and signal output travel through to and from the set of magnetic sensors. The intermediary circuit components include a mixer.

The system functions as a highly customizable field sensor (i.e., magnetometer), or field gradient sensor (i.e., gradiometer), that may be implemented independently or as an integrated magnetic sensor array. In many variations, this highly customizable field sensor array is a "chip" based field sensor array that may be implemented generally in any electronic system.

The system may leverage the configuration of the set of magnetic sensors 120 on the circuit base platform 110 to enable: the measurement of EM fields over varying frequency spectrums (e.g., narrow or broad). Dependent on implementation, i.e., dependent on the number and arrangement of the set of magnetic sensors 120 on the circuit base platform 110 and the implemented operating modes, the system can provide highly varied functionality. General system capabilities may include: multi-dimensional field measurements, multi-dimensional field gradient measurements, broad frequency band measurements, narrow frequency band measurements, simultaneous multiple frequency band measurements, and field measurements over highly variable frequency bands.

Additionally, the system may be enabled to: make highly sensitive field measurements (e.g., measure fields up to the order of 100 mT and as low as 1 fT); provide dense sensor array arrangements (e.g., 10 sensors/cm$^2$ sensor density) that may measure field variations at length scales on the order of 100 μm to 1 m; provide efficient low power functionality (e.g., using 10's of μW), and provide high bandwidth magnetic field measurements in a range from DC-GHz. The system may also be configured to provide improved sensor measurements through temporal and spatial enhancement of field measurements.

In some variations, particularly for "sensor dense" sensor array variations, the system may further include shielding 140. Shielding 140 may comprise passive or active shielding components and/or shielding protocols to reduce system and environmental noise and enable a plurality of sensors to function in proximity with each other.

The system may be implemented as a chip-based sensor array. In some variations, the system may comprise an integrated System-on-a-chip (SoC), such that all components are situated on an integrated chip (IC), circuit base platform 110. Alternatively, the set of magnetic sensors 120 may be located on the IC circuit base platform 110, whereas other system components (such as a power source and processor) may, or may not, be located elsewhere (e.g., on a distinct chip).

This chip-based sensor array may be a customized unique implementation. Alternatively, the chip-based sensor array may be an application specific integration circuit (ASIC) implementation, wherein the system is constructed and configured for a specific application implementation. Alternatively, the chip-based sensor array may be an application-specific standard project (ASSP) implementation, wherein the system is constructed to be generally incorporated into other systems. As part of the ASSP implementation, system components (e.g., groups of sensors) may be permanently, or indefinitely, activated or deactivated as per desired specific implementation.

The system may include a circuit base platform 110. The circuit base platform 110 functions as the physical integration of sensors and other components of the system. The various system components may be situated on, around, printed on, travel through or be connected to the circuit base platform 110. The circuit base platform 110 can include the base substrate and/or other packaging elements used in delivering the system in as an electronic component for use within some application. The circuit base platform 110 in one variation may be or include a printed circuit board (PCB). The PCB may be any general or specific type of PCB. The circuit base platform 110 in another variation can be or include an application specific integrated circuit (ASIC) or any other type of integrated circuit such as a field-programmable gate array (FPGA), system on a chip (SoC), and/or other suitable variation.

The circuit base platform 110 may vary in size and/or shape dependent on implementation. Furthermore, dependent on implementation, the circuit base platform may be a rigid or flexible structure. That is the size, shape, and/or rigidity of the circuit base platform 110 may vary with both the number of sensors incorporated with the circuit base platform and/or the intended use. In this manner the circuit base platform 110 geometry and tensile strength may additionally aid in positioning and protecting sensors for use. In one example for a user virtual reality (VR) experience, the circuit base platform 110 may be sufficiently small to fit on or within a pair of VR glasses (e.g., 1 inch by 1 inch).

A PCB and or chip circuit base platform 110 can include any suitable circuitry and electrical components to connect, both physically and electrically, both system and external components. The circuitry may comprise any type of general wiring or traces. In some variations, the circuitry comprises wire bonds. Wire bonds may be composed of any conductive material (e.g., copper, silver, gold or aluminum). The geometry of the wire bonds positioning may be any generally desired positioning. In some variations, the wire bonds are maintained at a distance such that minimal or no amount of inductive coupling occurs between distinct wire bonds.

In some variations, different subcomponents of the system may be implemented as distinct circuit components that are integrated together. For example, different subcomponents may be packaged as an ASIC component and then combined on a PCB. These circuit subcomponents may include one or multiple sensors. In one exemplary implementation, a PCB, or ASIC, circuit base platform includes multiple sensors (e.g., the entire set of magnetic sensors 120). In another exemplary implementation, a PCB, or ASIC, circuit sub-system may include a single sensor from the set of magnetic sensors 120, where multiple circuit sub-systems may then be connected to form the "entire" circuit base platform. The circuit base platform 110 may provide the base geometry for the set of magnetic sensors 110 and other incorporated circuit components. In this manner, the circuit base platform 110 may enable a highly variable, but very controlled spacing between sensors. Sensor spacing may be tuned for any desired application: they can be placed very close together (~100 μm) for applications where very high resolution is required (e.g., circuit board testing), or further apart (~1 cm) for applications where a larger area is required and super tight spacing isn't as useful (e.g., brain imaging).

In addition to enabling highly modifiable and precise spacing, the circuit base platform may enable control over the geometry of sensors and sensor components. In one variation, circuit elements (e.g., oscillators, amplifiers, inductors), may be positioned to minimize interference. In one example, inductors may be positioned on the circuit base platform 110 orthogonal to the axis of detection of proximal magnetic sensors. In another example, circuit components may be situated at some minimal distance, where the minimal distance may be implementation specific, to reduce interference. In another variation, the circuit base platform 110 may enable positioning the set of magnetic sensors 120 in a grid pattern (or in alternate desired geometry). In one example, the set of magnetic sensors 120 is situated on the circuit base platform, such that the sensitive axis of each sensor forms a grid pattern. This grid pattern may comprise a geometrical shape pattern (e.g., rectangular, triangular, hexagonal, pattern) where adjacent sensors alternate sensor orientation (e.g., alternating 'x' and 'y' direction, or alternating 'x', 'y', and 'z' orientation). This may function to provide more even sensor coverage. In variations, where the system is implemented for a specific field use-case (i.e., the system is implemented to measure a specific field where the positioning of the field is known), the circuit base platform 110 may enable positioning the set of magnetic sensors 120 (or a subset of them) along the field lines that are to be measured to improve field measurements. For example, for a system implementation to measure a dipole from a specific part of the brain (e.g., a helmet sensor to measure parietal cortex activity), the circuit base platform 110 may enable positioning a magnetic sensor (or multiple magnetic sensors) along the dipole field line (e.g., z-direction) directly above the particular region of the brain (e.g., directly above the parietal cortex) as part of the helmet. Additionally, the circuit base platform may enable positioning a series of orthogonal magnetic sensors (e.g., x- and y-direction) around the magnetic sensor along the dipole field line. In a third variations, sensors may be placed in 2D and/or 3D space as needed. For example, as part of a shielding helmet, sensors may be positioned along a 2D grid on the inside of a shielding helmet (e.g., the 2D curved hypersurface interior of the helmet surface). The circuit base platform 110 may additionally enable other sensors, and sensor components, on the outside of the helmet e.g., for reference measurements).

The system includes a set of magnetic sensors 120. The set of magnetic sensors 120 comprise sensors that function to measure electromagnetic (EM) waves and/or the properties of EM waves (e.g., direction, magnitude, gradient, etc.). That is, the set of magnetic sensors 120 function as a sensor array to measure EM field activity. The set of magnetic sensors 120 thus provides a sensor array functionality, wherein the array functionality is leveraged to provide multidimensional measurement, "better" high resolution "imaging" of the EM field activity, and/or provide a spatial mapping of the EM field activity. For example, in a variation where the system is incorporated as part of a helmet to measure brain activity, the set of magnetic sensors 120 may span the entire interior surface of the helmet, enabling measurement of the magnetic field magnitude along the surface of the brain for the entire head. In another example, the system may be used as part of a sensor device used to build microchips, wherein the sensor array may be set up to visualize a three-dimensional image of the microchip that is being built.

The system may be configured to turn on, or off, each sensor from the set of magnetic sensors 120, such that they may be set to active or inactive states. The system may additionally be configured to turn on, or off, subsets of sensors simultaneously. As used herein, a subset of sensors, may refer to a group of sensors, comprising at least one sensor and up to all the sensors in the set of magnetic sensors 120. That is, subsets of sensors, comprising at least one sensor and up to the entire set of set of magnetic sensors 120, may be turned on or off, as desired per function and implementation. In addition to or as an alternative to active and inactive states, some system variations may have magnetic sensors 120 that can be operated in different power states where resolution, range, accuracy, sampling windows, and/or other operating patterns can be adjusted based on how the sensor is driven.

Active/inactive states of sensors may be used to reduce power consumption (i.e., inactive sensors may use less or no power). Additionally or alternatively, active/inactive states of the sensors may be part of the sensor functionality (e.g., to prevent noise between sensors). In this manner, subsets of sensors may be cycled through active and inactive states as necessary. In one variation, subsets of sensors may be cycled from active to inactive and back in less than 0.1 ms. This "slower" time cycling may be implemented in power-saving variations. In another variation, subsets of sensors may be cycled from active to inactive and back in less than 0.01 ms. In one variation, subsets of sensors may be cycled from active to inactive and back in less than 1 ms. In another variation, subsets of sensors may be cycled from active to inactive and back in less than 1 µs. In a fourth variation, subsets of sensors may be cycled from active to inactive and back in less than 0.1 µs. In another variation, subsets of sensors may be cycled from active to inactive and back in less than 0.01 µs. In one variation, subsets of sensors may be cycled from active to inactive and back in less than 1 ns. This "faster" time cycling may be implemented for goldcoding or other noise rejection technique variations.

The set of magnetic sensors 120 may comprise a plurality of sensors (multi-sensor). Each sensor from the set of magnetic sensors 120 may comprise a single sensor, that has the capability of making a single field measurement; or a multi-sensor capable of making multiple field measurements. For example, the single sensor variation may be implemented in use cases where simple localized monitoring is sufficient (e.g., as a heart-rate monitor). Alternatively, for the multi-sensor variations, multiple sensors may enable heart-rate monitoring simultaneous to improving the heart-rate resolution and/or to minimizing external noise during heart-rate monitoring.

In one variation, each sensor from the set of magnetic sensors 120 may comprise a single integrated chip (IC) (i.e., a sensor IC). The sensor components for one sensor are situated on, or on part of the sensor IC such that the sensor IC effectively functions as a magnetic sensor. In this manner, the set of magnetic sensors 120 comprises a set of sensor ICs, wherein the set of sensor ICs are situated on a PCB circuit base platform 110. This variation may be particularly useful for certain shielding implementations, where each sensor has an associated shielding on its own sensor IC or adjacent to the sensor IC on the PCB. Additionally, this variation may enable the addition of other components to be used with the multi-sensor system.

In another variation, subsets of sensors from the set of magnetic sensors 120 may be grouped together on a single IC. These grouped ICs may then be positioned on the PCB circuit base platform 110 in a similar fashion as for individual sensors per IC. Subsets of sensors may be used to optimize sensor functionality or to provide complimentary functionality. For example, each IC may contain three orthogonal magnetic sensors, such that a single IC may measure fields in the 'x', 'y', and 'z' directions. In another example, a single IC may contain two sensors that measure fields along the same direction, with a distinct determined space between the two sensors. In this example, each IC/magnetic sensor grouping may effectively function as a gradiometer, where measurement of the EM field at both points may be used to determine the local field gradient.

In a third variation, a SoC variation, all sensors from the set of magnetic sensors 120 may be situated onto a single IC. Thus, the sensor components for all the sensors comprise components on the IC. In one example of this variation, the circuit base platform may comprise a generalized ASSP field measurement chip. The chip may then be incorporated into other devices to provide field measurement properties to the device. For example, an ASSP field chip may be incorporated into a headset device, where field measurements may be used to determine the orientation of the headset device (e.g., in relation to the magnetic field of the earth).

The sensors of a multi-sensor system may be in parallel or in series. That is, subsets of magnetic sensors, from the set of magnetic sensors 120, maybe situated in series or in parallel. Series or parallel arrangements may be implemented on any length scale. For example, ICs, containing a single sensor each, may be situated in parallel or in series on a PCB. Additionally or alternatively, magnetic sensors may be directly situated in parallel or in series on the PCB. In another example, sensors may be situated in parallel or in series on an IC. In a third example, sensors may be situated in parallel or in series on a plurality of ICs which are then situated in parallel or in series on a PCB.

The set of magnetic sensors 120 may be arranged in any suitable array formation. In some variations, the set of magnetic sensors 120 are arranged in a 2D array on the circuit base platform 110. They may be arranged in a regular grid, in a linear pattern, a circular arrangement, and/or any suitable arrangement along 2 dimensions. In many variations, the set of magnetic sensors are arranged in a two-dimensional hypersurface arrangement (e.g., along the interior surface of a helmet, along a looped armband, etc.) on the circuit base platform 110. Similarly, the set of magnetic sensors 120 may be arranged serially along some line or path. The set of magnetic sensors 120 may alternatively be arranged in a non-regular pattern, which may, for example, be configured for a particular application. The set of magnetic sensors 120 may be oriented in uniform directions but may alternatively have varied orientations and directions. In some variations, the set of magnetic sensors 120 may also be arranged in 3D space. In one basic variation, one subset of magnetic sensors 120 may be positioned on one side of a PCB and a second subset of magnetic sensors may be positioned on the opposite side of the PCB. With more complex PCB designs, which may make use of flexible PCB material or alternatively multiple PCBs that are then integrated into a single unit, the set of magnetic sensors 120 may be arranged in any suitable arrangement.

The number of sensors per chip may vary. In one variation there may be on the order of ~10 (e.g., 10-99) magnetic sensors per chip. In another variation, there may be on the order of ~100 (e.g., 100-999) magnetic sensors per chip. In actuality, the set of magnetic sensors 120 may comprise any number of sensors: In one example, the set of magnetic sensors 120 comprises 1 sensor (e.g., a heart sensor). In another example, the set of magnetic sensors 120 may comprise 2 sensors. In another example, the set of magnetic sensors 120 may comprise 4 sensors. In another example, the set of magnetic sensors 120 can comprise a set of sensors in the order of 10 sensors (e.g., 10-90 sensors). In another example, the set of magnetic sensors 120 could comprise a set of sensors in the order of 100 sensor (e.g., 100-1000) sensors. For example, the system could be implemented to enable a patch of 100-200 sensors. In another example, the set of magnetic sensors 120 could comprise a set of sensors with greater than a thousand sensors. For example, a helmet or armband may use multiple instances of the system to include thousands of sensors. The number of sensors may be implementation specific, wherein the range of sensors may vary significantly. For example, an armband may be implemented for peripheral nerve sensing (e.g., 1000s of sensors), for control interfaces for gaming (e.g., 100s of sensors) or connected devices (e.g., 10s of sensors). In another example, for helmet implementations, the helmet may require data directly from the brain (e.g., 1000s of sensors), could be used for diagnostics or brain training data (e.g., 10,000s of sensors); a brain patch for small-area brain sensing (e.g., 100s of sensors), or could be used for gaming or wellness applications such as meditation, sleep, etc. (e.g., 10s of sensors).

Each sensor from the set of magnetic sensors 120 may be identical or distinct. In one variation, all sensors from the set of magnetic sensors 120 comprise an identical magnetometer (i.e., field sensors). In another variation, the set of magnetic sensors 120 may include distinct types of magnetometers (e.g., durable but low sensitive magnetometers for general measurements, and highly sensitive and noise sensitive magnetometers for precision measurements). Each sensor may contain at least one field sensor, although it may contain multiple field sensors. Examples of types of magnetic sensors include: Hall sensors, flux gates, ADFMR sensors, giant magnetoresistance (GMR) sensors, and magnetoresistance (MR) sensors).

In addition to the set of magnetic sensors 120, the system may include or incorporate data from other types of sensors. These additional sensors may add new functionalities (e.g., location detection, motion detection, temperature detection, EM field gradient measurement), and/or improve magnetic sensor functionality (e.g., noise reduction, Signal-to-Noise Ratio (SNR) amplification, reduced power usage, improved EM field measurement). Examples of desired sensor components may include: inertial measurement units (IMUs), accelerometers, additional magnetometers, digital thermometers, GPS receivers, IR sensors, cameras, communication antennas, microprocessors, signal amplifiers, bandpass filters, attenuators, inductors, phase shifters, couplers, mixers, matching networks, analog to digital converters, and comparators. These sensors may be used in coordination with the data input of the field sensor. For example, these sensors may be used to identify and remove unwanted external signals (e.g., noise). Also, another example, knowledge of device movement and orientation may be utilized to better filter out the magnetic field of the earth. Dependent on implementation, other types of sensors may be incorporated with or separate from the set of magnetic sensors 120. For example, reference sensors on the outside of shielding, when there is a grid of sensors inside the shielding. In one implementation, reference sensors for a helmet measuring brain activity may be positioned on a person's body, significantly removed from the head (e.g., on the foot of a person).

Figure 3:
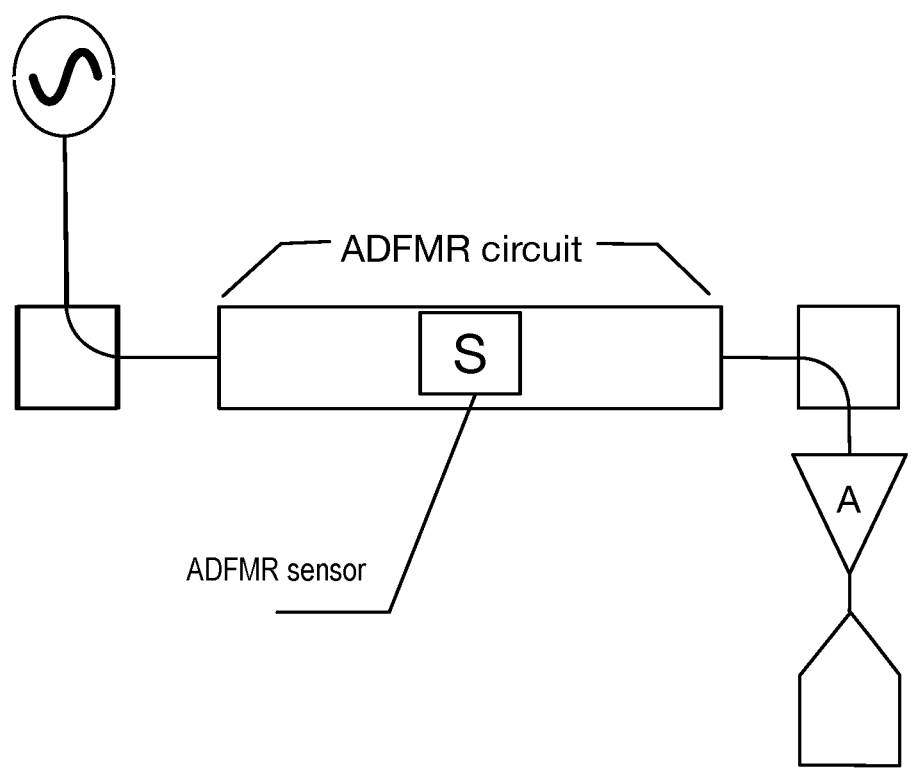
FIG. 3 is a general schematic for an ADFMR sensor device.

In preferred variations, the magnetic sensors from the set of magnetic sensors 120 are acoustically driven ferromagnetic resonance (ADFMR) sensor devices. The ADFMR sensor device may comprise a single or multi-sensor array that comprises: at least one ADFMR circuit that includes an ADFMR sensor; and potentially additional circuits (e.g., reference circuits), as described below. FIG. 3 shows a simplified ADFMR sensor device with a single ADFMR circuit containing a single ADFMR sensor. The ADFMR sensor device functions to measure EM fields via an ADFMR sensor, i.e., measures EM fields through the propagation of acoustically driven waves on the surface of a piezoelectric substrate through a magnetostrictive element, i.e., a Surface Acoustic Wave (SAW) device. The interaction between the acoustic waves and the magnetostrictive element is strongly dependent on magnetic fields. In presence of an EM field, propagating acoustic waves are altered in proportion to the strength of the field, thus enabling measurement of the field.

The ADFMR sensor can include at least one acoustic resonator (e.g., IDT) and a magnetostrictive element (e.g., ferromagnet). In SAW device variation of an ADFMR sensor (i.e., at least two IDT acoustic resonators), the ADFMR sensor may include any geometry shown in FIGS. 4, and 6-14; and/or a more complex geometry with the combination of the figures and/or addition of components as shown in those figures. Generally, the IDTs may be configured for any range of frequency function, i.e., set to a desired frequency with a narrow or wide bandwidth. Although simply referred to as the ferromagnet, the magnetostrictive element may be any general magnetostrictive element (e.g., diamagnet, paramagnet, anti-ferromagnet, etc.). Additionally, the magnetostrictive element may be given any directional bias (e.g., 'x'-direction, 'y'-direction, 'z'-direction) using the methods described above and/or through the use of any other method used for biasing magnetostrictive elements. In addition to the ADFMR sensor, the ADFMR sensor device may comprise any and/or all circuit components as described below for the ADFMR sensor device.

The ADFMR sensor device includes an ADFMR circuit that includes an ADFMR sensor. As shown in the model schematic FIG. 4, for an ADFMR sensor, the ADFMR sensor may utilize Interdigitated transducers (IDTs) for propagating acoustic waves, i.e., a SAW device. As shown in FIG. 5, IDTs may include interlocking comb-shaped arrays of metallic electrodes that form a periodic structure (e.g., on the piezoelectric substrate). Alternatively, other types of acoustic resonators may be utilized for generating acoustic waves. In the FIG. 4 variation, acoustically driven waves are generated and absorbed by IDTs, i.e., an input IDT generates the acoustic wave and an output IDT absorbs the "modified" acoustic wave. IDTs are acoustic resonators that can convert electric signals (e.g., radio frequency signals) into acoustic waves (input IDT) and convert acoustic waves into electric signals (output IDT). The input IDT functions by converting a radio frequency (RF) electric signal to a surface acoustic waves (SAW) using the piezoelectric effect. The output IDT functions by absorbing the SAW and converting it back to an electric signal.

The input IDT may function over a specific electric signal bandwidth. That is, electrical signals over a certain frequency range may induce the input IDT to generate an acoustic wave, wherein frequencies outside of the range will have little to no effect on the IDT; i.e., an electric signal complementary, in resonance, with the periodic structure of the input IDT generates a SAW. The bandwidth for the input IDT may be set as desired. In some variations, the input bandwidth may be narrow (e.g., 1 MHz) and in some variations the input bandwidth may be wide (e.g., 500 MHz). In variations, the set of magnetic sensors can use ADFMR sensor devices that have differently calibrated IDTs for a selection of measuring capabilities across at least a subset of the ADFMR sensor devices.

In some variations, the input IDT may function at multiple electrical signal bandwidths. That is, electrical signals over multiple distinct bandwidths may induce the input IDT to generate acoustic waves, wherein frequencies outside of these ranges will have little to no effect on the IDT. In these variations, each distinct bandwidth may induce the input IDT to generate a distinct acoustic wave corresponding to that bandwidth. Additionally, in these variations, the input IDT may comprise multiple distinct periodic structures, wherein each periodic structure corresponds to an activating resonant frequency electrical signal. Multi-band frequency input IDTs may enable the multiplexing the ADFMR sensor for use in multiple field measurements. For example, in a two-frequency planar field implementation, one frequency bandwidth may be used to measure fields in the 'x' direction and one frequency bandwidth may be used to measure fields in the 'y' direction. Wide-band IDTs may rely on the electrical oscillator to generate a variety of frequencies that are distinct and enable operation over a large bandwidth. For example, the 500 MHz wide bandwidth input IDT can 'multiplex' e.g., 500 unique signals space 1 MHz apart. Additionally or alternatively, the input IDT can operate using harmonic frequencies to enable multi-band frequencies. The harmonic frequencies may be tuned by the IDT design. In one example implementation, an input IDT with a fundamental frequency at 100 MHz, may have harmonic frequencies at 200 MHz, 300 MHz, 400 MHz, etc. In another example implementation, the input IDT with a fundamental frequency at 100 MHz may have harmonic frequencies at 300 MHz, 500 MHz, etc.

That being said, the ADFMR sensor may have directionality (or multiple directionalities). That is, the ADFMR sensor may be sensitive to EM fields with a specific orientation(s) or direction(s), while being minimally responsive to fields in orthogonal directions. The ADFMR sensor may be created, or induced, to have directionality (also referred to as directional bias). That is, the ADFMR sensor may be made direction specific. Directional bias may be implemented by tuning the magnetic response of the ferromagnet(s) comprising the ADFMR sensor. Examples of implemented tuning may include exchange biasing, dipole biasing, and/or using shape anisotropy. Any number of biasing, or other, methods may be used to induce ADFMR sensor directionality, and the system may implement an ADFMR sensor with any desired type of biasing. In this manner, each distinct magnetostrictive element (e.g., ferromagnet) may have its own bias, enabling distinct orientation measurements.

In a first variation, an exchange bias ADFMR sensor is implemented. An exchange bias ADFMR sensor comprises an anti-ferromagnetic layer laid upon or underneath the ferromagnet. The magnetization of the anti-ferromagnetic layer may function to fix the magnetization of the ferromagnetic layer in a certain direction.

In a second variation, a dipole bias ADFMR sensor is implemented. The dipole bias ADFMR circuit comprises additional magnet(s) aligned along the direction of desired bias.

In a third variation, an anisotropic ADFMR sensor is implemented. An anisotropic ADFMR sensor comprises an ADFMR sensor wherein the ferromagnet is magnetized. A magnetized ferromagnet may be implemented in a way desired. In one example, the ferromagnet may be magnetized during fabrication of the ADFMR sensor device. By applying a magnetic field while depositing the ferromagnetic film, the ferromagnet may be magnetized. In a second example, the ADFMR sensor (i.e., the ferromagnet) is heated up while a magnetic field is applied to the system.

In a fourth variation, a shape bias ADFMR sensor is implemented. In this variation, the shape of the ferromagnet functions to implement a directional bias in the ADFMR sensor. For example, an oval ferromagnet may have a directional bias along the longer axis of the oval. Alternatively, a circular ferromagnet may not induce a directional bias.

Figure 6:
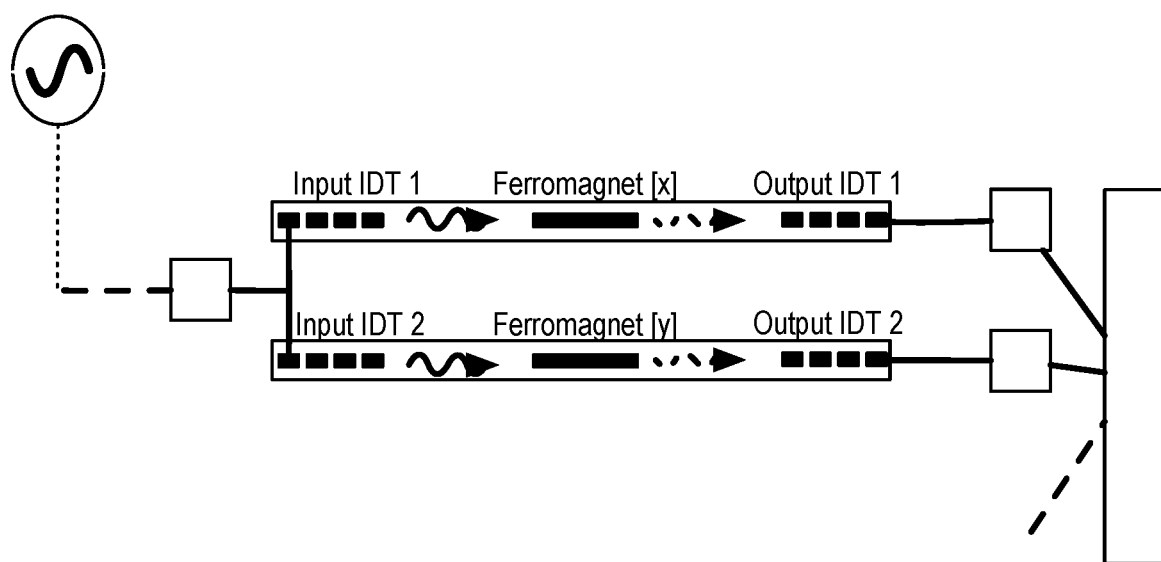
FIG. 6 is a schematic of two single sensor ADFMR sensors, containing magnetic film with orthogonal magnetic bias, incorporated into the system.
Figure 7:
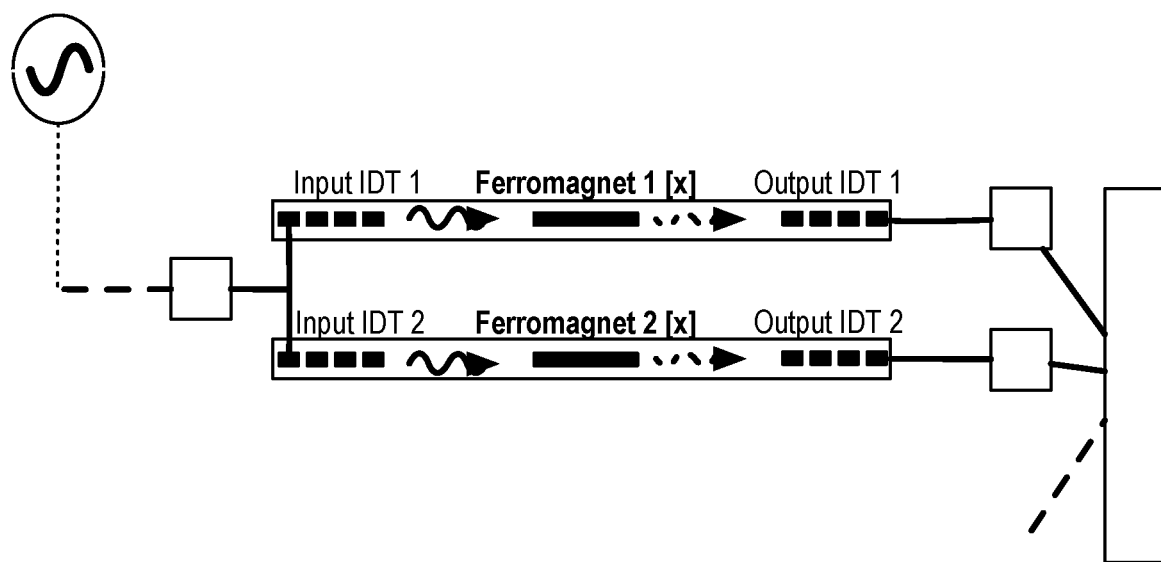
FIG. 7 is a schematic of two single sensor ADFMR sensors, containing magnetic film with identical magnetic bias, incorporated into the system.
Figure 8:
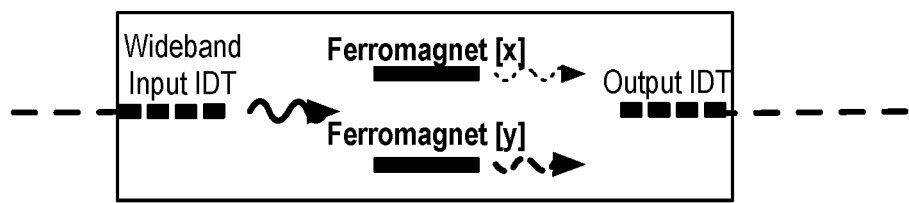
FIGS. 8-14 are different example schematics of ADFMR sensors.
Figure 9:

In some variations, each ADFMR sensor may comprise multiple sensors (i.e., multi-sensors) of varying numbers, as desired. Multi-sensors may be in series or parallel. Unless stated otherwise, no distinction will be made herein between ADFMR sensors that comprise one or multiple sensors. That is, the terms ADFMR sensor and ADFMR multi-sensor may be used equivalently to refer to ADFMR sensors that are enabled to make one, or more, field measurements. In the same manner, an ADFMR sensor device is implied to have the ability to measure multiple EM fields. The multi-sensor capability of the ADFMR sensor device may be incorporated with an ADFMR sensor, and/or an ADFMR sensor device may include multiple ADFMR sensors, wherein each ADFMR sensor may additionally have multi-sensor capability. In one example, the multi-sensor capability may be an ADFMR sensor device with multiple directionally biased ADFMR sensors. In one implementation of this example, as shown in FIG. 6, two orthogonal ADFMR sensors may be used to measure the EM field in a plane (e.g., with one sensor aligned in an x-direction and one sensor aligned in a y-direction). Similarly, three orthogonal ADFMR circuits may enable three-dimensional measurement of EM fields. In a second example, the ADFMR sensor device may include at least two sensors along the same orientation. As shown in FIG. 7, multiple ADFMR sensors may be implemented along the same orientation (e.g., with two sensors aligned in parallel directions). Multiple field measurements along the same orientation may enable measurements of the gradient of the EM field, help reduce noise of field measurements, and/or improve the spatial resolution of field measurements. Alternatively, as shown in FIG. 8 and FIG. 9, a single ADFMR sensor may be incorporated to measure the gradient. In a third example, each sensor may have ADFMR circuit in all orientations (same and different), enabling measurement of the EM field and the gradient of the field.

In addition to providing more sensor nodes to measure the EM field with, ADFMR multi-sensors may enable multi-dimensional field measurements, field gradient measurements, and improved resolution of both field and field gradient measurements. ADFMR multi-sensors may alternatively enable other functionalities.

In some variations, the system may incorporate varying numbers and functionalities of IDTs (e.g., low frequency IDT, high frequency IDT) and ferromagnets ('x' direction bias ferromagnet, 'y' direction bias ferromagnet). Varying implementations of IDTs may enable distinguishing between sensor outputs, improving sensor functionality, and enabling sensor multiplexing. For example, in variations that include frequency multiplexing, the set of magnetic sensors 120 may include one, or more, frequency subsets of magnetic sensors, such that the signal input directed to each magnetic sensor, from the frequency subset, is at a distinct frequency bandwidth. This distinct frequency bandwidth may still be identifiable from the signal output of each magnetic sensor. That is, the signal output from each magnetic sensor, from the frequency subset may be identifiable by frequency. In variations that include time multiplexing, the set of magnetic sensors 120 may include one, or more, time subsets of magnetic sensors, such that the signal input directed to each magnetic sensor from the time subset is generated over a distinct time interval. Correspondingly, the signal output from each magnetic sensor, from the time subset, may be identifiable by the distinct time interval of the signal output. In one example, the signal input time interval for each magnetic sensor, from the time subset, does not overlap with the signal input time interval for any other magnetic sensor from the time subset (i.e., the signal inputs do not occur concurrently). Correspondingly, the signal output from each magnetic sensor, from the time subset, may be identifiable as the only signal output at a given time. In a second example, the signal input time interval for each magnetic sensor, from the time subset, comprises a distinct time pattern of active and inactive time intervals for the signal input. Correspondingly, the signal output for each magnetic sensor, from the time subset, may be identified by the distinct time pattern of active and inactive time intervals.

Varying the number of ferromagnets may effectively vary the number of sensors for multiple measurements. For simplicity, variations for configurations of two sensor components (e.g., two input IDTs, two ferromagnets, two output IDTs) will be discussed. The same pattern may be expanded to implement variations with any number of ADFMR components. Depending on implementation, different subsets of ADFMR components may be grouped with different configurations of input and output IDTs. In some cases, multiple input/output IDTs operating at different frequencies may be connected together and used a single (or 'combined') input out. It should be noted that the inclusion of multiple ferromagnets on a single ADFMR circuit effectively converts the single sensor into multi-sensor. Thus, discussion of a multi-sensor may equally refer to ADFMR sensors with multiple ferromagnetic regions or the incorporation of multiple ADFMR circuits. In other words, a single ADFMR sensor may comprise one, or more, sensors from the set of magnetic sensors 120.

Figure 4:
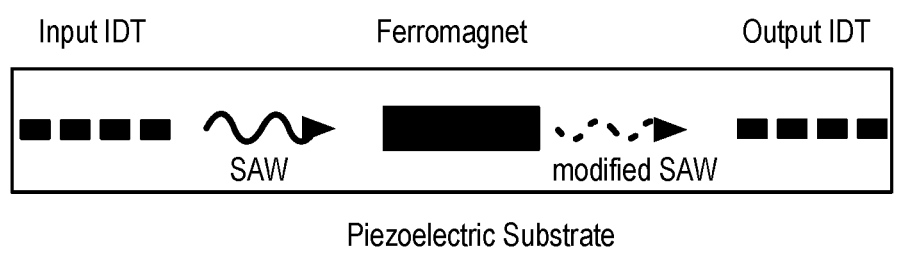
FIG. 4 is a schematic of a single sensor, SAW device, ADFMR sensor.
Figure 5:
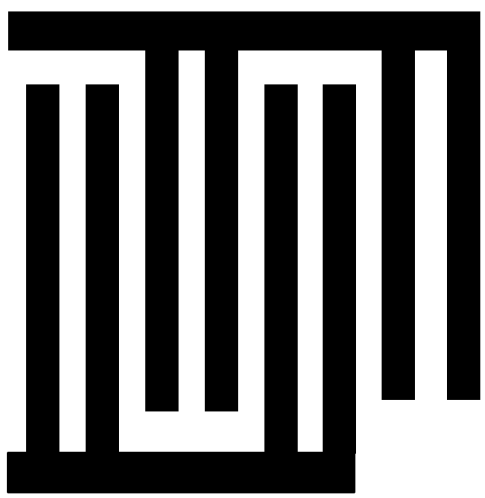
FIG. 5 is a schematic of an interdigitated transducer.
Figure 10:
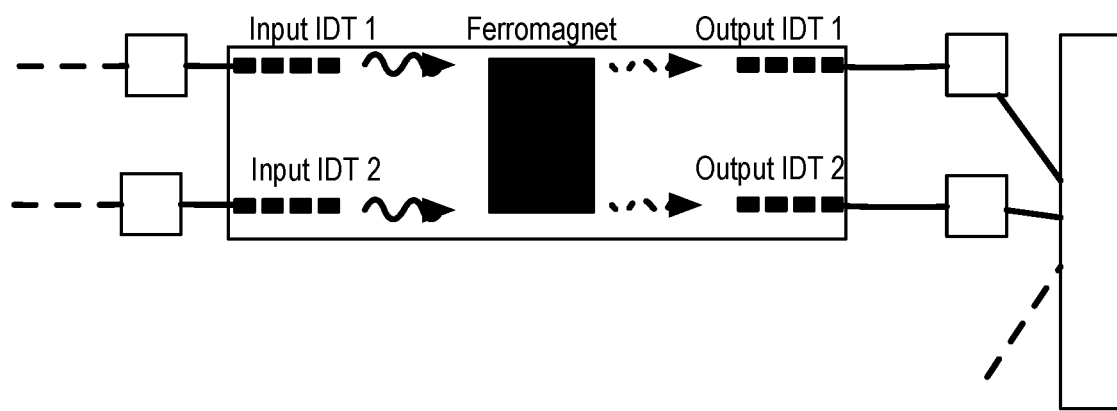

In one variation, as shown in FIG. 4, an ADFMR sensor from the set of magnetic sensors 120 has a single input and output IDT. For each ADFMR sensor, these pair of IDTs function at some bandwidth set by the input IDT. This may be a narrow bandwidth but may alternatively be a broad bandwidth. A somewhat analogous configuration, as shown in FIG. 10, may incorporate the same ferromagnetic/magnetostrictive element for two ADFMR circuits. Herein, the field measurements are positionally fixed closer to each other.

In another variation, the multi-sensor may have multiple input IDTs (e.g., for two sensors) for a single ferromagnet and single output IDT. The multiple input IDTs may enable measuring EM fields at multiple frequencies and/or multiple bandwidths. For a single ferromagnet, this configuration may be useful for a gradiometer implementation. As shown in FIGURE n, for two input IDTs, each one of the two, input IDTs may convert a distinct frequency to a SAW. Differences in the measurement, between the two frequencies, of an applied EM field may enable finding and removing noise from the system, and/or measuring the field gradient. Although the ADFMR sensor has a single output IDT, two different signals may (from the input IDTs) may be isolated by the frequency domain, if the two input IDTs function at differing bandwidths. Alternatively, the two different signals may be isolated by alternating (pulsing) signals from the two input IDTs.

In another variation, as shown in FIG. 8, each ADFMR sensor has a single input IDT and a single output IDT. The single input IDT generates an acoustic wave that propagates through two distinct ferromagnets (e.g., an 'x' direction bias and a 'y' direction bias ferromagnet) and then a single output IDT collects all the output acoustic waves into a single output signal. The input IDT may be a wide band signal IDT, alternatively, the input IDT may be a narrow band. A wide band signal IDT may enable separation of the signal that travels through the 'x' ferromagnet as compared to the 'y' ferromagnet. This variation effectively enables a single ADFMR circuit to function as a multi-sensor (e.g., that measures fields in two directions). In this frequency multiplexing implementation, a single digitization chain is implemented. That is, distinct sensor data may be later extracted by digitizing and Fourier transforming the output signal.

In an alternative variation for an ADFMR sensor with multiple ferromagnets and a single input IDT and a single output IDT, the ferromagnets may be situated in parallel along the ADFMR circuit. As shown in FIG. 9, the two distinct ferromagnets may be in parallel, wherein each ferromagnet has a distinct directional bias (e.g., an 'x' and a 'y' direction). In this variation, a single input signal travels through both ferromagnets and follows a single digitization chain.

Figure 12:
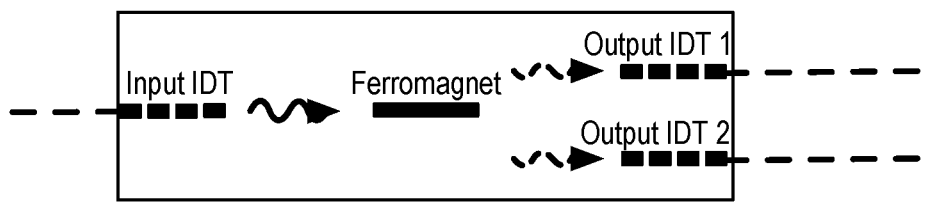

In one variation, as shown in FIG. 12, the ferromagnet of the ADFMR circuit may be connected to a single input IDT and two output IDTs. In one example of this configuration, the input IDT could be wideband, while the two output IDTs are narrowband. Thus, the output IDTs could be used to split the multi-frequency input signal into distinct channels, each with their own processing and digitization chain. This configuration would allow for a correlation measurement to be done on the two output channels, reducing added noise from the processing and digitization chain.

Figure 13:
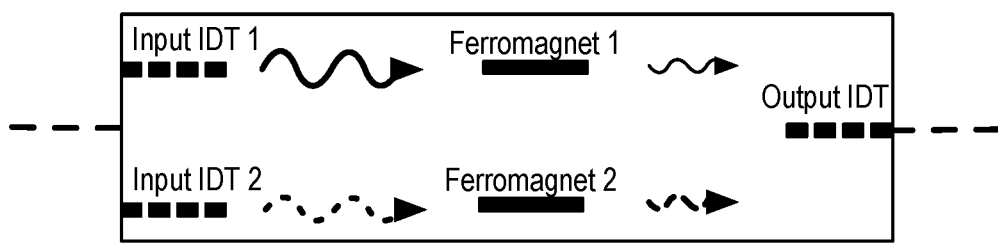

In another variation, as shown in FIG. 13, each ferromagnet of the ADFMR sensor has a distinct input IDT and where all signals travel out through a single output IDT. This variation thus has a single digitization chain, where signals from the two ferromagnets needs to be separated. Separation of signals may occur either by frequency or time domains. In one implementation, the two input IDTs function at different frequency bandwidths. The outputs from the two different ferromagnets may then be separated by isolating signals from the two different frequency domains. In another implementation, electric signals to the two input IDTs may be alternated. That is, signals may be pulsed to separate outputs from the two ferromagnets, where output signals for each ferromagnet would be located in distinct time intervals. This implementation may additionally help reduce sensor noise between with the system and may be useful for both interferometer and gradiometer implementations.

In one variation, as shown in FIG. 10, each ADFMR sensor has two input IDTs and two output IDTs for each ferromagnet. In this variation, a field may be analyzed at two distinct frequency domains. This may enable reducing signal noise. Additionally, the two output IDTs may also reduce noise by narrowing the bandwidth when converting the SAWs to electrical signals.

Figure 14:
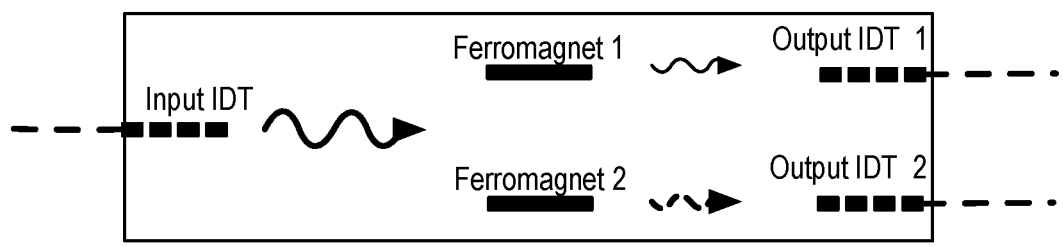

In another variation, as shown in FIG. 14, each ADFMR circuit has a single input IDT, two ferromagnets, and two output IDTs. In this variation, each ferromagnet has its own output IDT and thus digitization chain. In this variation, the same input signal may be used as part of a sensor for two distinct ferromagnets. This variation may be used with broad or narrow bandwidth signals, where frequency separation is not necessary to separate distinct outputs. Additionally, minimizing the input, may reduce the power cost of using this variation.

The base simplified schematic ADFMR sensor, as shown in FIG. 4, and the variations of the ADFMR sensor schematics, as shown in FIGS. 6-14, present sample representations for variations of the ADFMR sensor. In these sample representations, the number of any one component is limited to two (e.g., two input IDTs, two ferromagnets, two output IDTs). The base ADFMR sensor and sample representations show generally how additional components may be added and how the ferromagnet may be positioned (e.g., serial, parallel, or physically expanded). In general, the ADFMR sensor may be expanded to any desired size with any number of components by expanding any of the sample representations, and/or combining the sample representations.

The system may be configured to turn on or turn off subsets of sensors from the set of magnetic sensors 120. For ADFMR sensor device variations, ADFMR sensor devices, and circuit components, may be activated or deactivated as desired. More precisely, the system may be configured to turn on or turn off individual sensor components (e.g., input IDTs, output IDTs, power to the ADFMR sensor, etc.), individual sensors, subsets of sensor components, and/or any subsets of sensors from the set of magnetic sensors 120 at any time. In some variations, the system may be configured to turn on or turn off sensors and/or sensors components with sub-microsecond precision times. In one implementation, sensors, and sensor components, may be turned on or turned off with 1 microsecond precision. In another implementation, sensors, and sensor components, may be turned on or turned off with 0.1 micro-second precision. In another implementation, sensors, and sensor components, may be turned on or turned off with 10 nanosecond precision. In another implementation, sensors, and sensor components, may be turned on or turned off with 1 nanosecond precision. This independence of the function of sensors and sensor components may improve device functionality and/or enable additional functionalities. For example, subsets of the set of magnetic sensors 120 may be activated in succession such that while sensor nodes from a single sensor, or groups of sensors, are actively measuring an EM field, other nearby sensors are inactive. This type of measurement may help reduce noise measured by the activated sensors, by reducing external sensor noise (i.e., cross-talk) during measurements. In some implementations of this example, only certain sensor components may be turned off (e.g., components that emit radio frequency signals). In a second example, sensors may be generally inactive, and are only activated at certain times (at some frequency of activity). This second example may additionally help to reduce power consumption.

In some multi-sensor/multiplexing variations, adjacent sensors may be configured to alternate from active to inactive states. Alternating from active to inactive states (and vice-versa) may function to reduce EM interference. In this manner temporal use of acoustic wave transmission may be leveraged to reduce radio frequency (RF) noise. In one example of temporal use of the acoustic wave transmission, wherein it takes acoustic waves approximately 100-1000 ns to propagate across each ADFMR circuit, for a two sensor multi-sensor: The excitation signal for the first sensor is first activated for ~500 ns and then turned off. The excitation signal for the second sensor is then activated for ~500 ns and then turned off as the sensors alternate turning on and off. In this manner acoustic signal from the 1st sensor and second sensor may be used with reduced interference (i.e., cross-talk).

The system includes a circuit system 130. The circuit system 130 functions as the electrical integration of sensors and other components of the system. Thus, the circuit system includes a signal input to the set of magnetic sensors 120, and a signal output from the set of magnetic sensors. The circuit system 130 additionally includes intermediary circuit components that modify circuit the signal input and signal output. Examples of the intermediary components include a power source, mixer, filters, analog to digital converters, digital to analog converters, attenuators, inductors, phase shifters, amplifiers, etc.

The circuit system 130 includes a signal input and a signal output. As the signal input is the signal to the set of magnet sensors 120 and the signal output is the signal from the set of magnetic sensors, it may not always be clear what is an "input" or "output", particularly in series configurations of the sensors. Generally, the terms signal input and signal output are used to describe the signal prior to any interaction with the set of magnetic sensors (i.e., signal input), and after any interaction with the set of magnetic sensors. More precise language will be used to describe specific sensor interaction.

The circuit system 130 includes a signal input. The signal input is an electrical oscillator signal input directable to each magnetic sensor in the set of magnetic sensors 120. Although initially electrical oscillator signal, the signal input may be modified (e.g., converted into a surface acoustic wave).

The circuit system 130 includes a signal output. The signal output comprises the signal output of the set of magnetic sensors 120. Thus, the signal output includes the magnetic field measurements of the set of magnetic sensors 120. Preferably, the signal output from each magnetic sensor, from the set of magnetic sensors 120, is individually selectable.

In some variations, the system may include shielding 140 (also called sensor shielding). Shielding 140 may function to isolate, or compensate, for the effects of environmental (e.g., magnetic field of the earth, local magnetic fields) and system (e.g., sensor generated) noise on field measurements. In this manner shielding 140 may leverage shielding components to improve functionality, accuracy, and/or precision of the multi-array sensing component. Sensor shielding 140 may include shielding components for: sensor components, for each sensor from the set of magnetic sensors 120, for groups of sensors, for the circuit base platform 110 and/or for the entire system. Types of sensor shielding 140 may vary dependent on implementation and what types of signals may wanted to be shielded against. Shielding 140 may comprise passive or active shielding. Passive shielding may comprise high permeability material(s) encircling the set of magnetic sensors 120. Examples of passive shielding include mu metal or faraday cage. Examples active shielding include: field coils. The incorporation of shielding 140 may be selective. That is, shielding 140 may be incorporated to "protect" a subset of magnetic sensors, from the set of magnetic sensors 120, from undesirable noise. This may be done for a variety of reason, particularly to enable the measurement of both environmental and system noise.

In many variations, the incorporation of passive shielding may be implementation specific, such that the passive shielding. For example, in one implementation of the multi-array magnetic sensing component incorporated in a helmet, passive shielding may comprise an approximately spherical (e.g., hemisphere, or head/helmet-shaped) shielding that would fit around user's head as part of the helmet. The set of magnetic sensors 120 would then be situated within the spherical shielding, thereby passively shielding the sensors from the external environment. In another example, of for a 'z-oriented' sensor, the shielding may comprise a cylinder (e.g., a faraday cage) with the long axis along z, such that it would shield 'x' and 'y' direction field. In a third example, passive shielding (e.g., mu-metal) may be incorporated in between sensors, thereby preventing and/or reducing cross-talk noise between sensors.

In active shielding variations, the shielding 140 may function in conjunction with processing system to modify, isolate, and/or counteract system and external nose elements. In one active shielding 140 variation, the shielding may include a field coil (FC). The field coil could be a direct current (DC) coil, an alternating current (AC) coil, and/or any suitable coil or system for creating a magnetic field. Any other suitable component that can create a field to offset the power output may be used. The field coil functions to generate magnetic field bias to positively or negatively offset the output of the sensor. In one variation, the field coil counters the external field by generating a local field that effectively reduces and/or cancels the external field in proximity to the system. In another variation, the field coil may optimize the subtraction/noise rejection bias point, thereby reducing the output power from the cancellation loop. The field coil may be implemented to offset the power output to a small output regime wherein circuit components function linearly, thereby reducing systematic error to non-linearities. For example, an amplifier may have a much smaller range of linear amplification as compared to the sensor output. Reducing the range of the sensor output would thus enable linear functionality of the amplifier. The field coil could potentially apply a magnetic field at any frequency (or combination of frequencies) as needed. For example, if the system were exposed to a large unwanted signal from power lines (e.g., 60 Hz) in addition to the Earth's field, the unwanted power line alternating field as well as the Earth's field could be cancelled out. The field coil may be used to apply any suitable type of canceling magnetic field.

The field coil may offset the power output to any desired range. In some variations, the field coil may offset the external field to near zero. In other variations, the field coil may alternatively, or additionally, offset the magnetic field to a range where the sensor functions optimally. For example, in implementations where the system is used as a gradiometer, the field coil may offset the magnetic field to the regime where a change in the external field would lead to the largest change in power output (e.g., inflection point of the output power spectra). Thus, for a given frequency, the field coil may enable modification of the external field such that activity is centered around an inflection point of the curve.

In some variations, the system may include a processing system. The processing system may comprise a system component (i.e., processor) located on the circuit base platform, or an external component that works in conjunction with the system and system components. That is, the processing system may be attached directly to other system components. Alternatively, the system may not include a processing system or may utilize an external processing system.

The processing system, functions to digitize the sensor signals from the set of magnetic sensors 120 and isolate each sensor signal. That is, in multi-sensor variations, the processing system may be involved in processing signals, i.e., digitizing signals and separating sensor outputs. The processing system may thus take the output signal generated from multiple parallel sensors and isolate the output from each sensor from the signal. Additionally, the processing system may function to enable and control different system operating modes (e.g., low power operating mode and calibrating modes).

Figure 11:
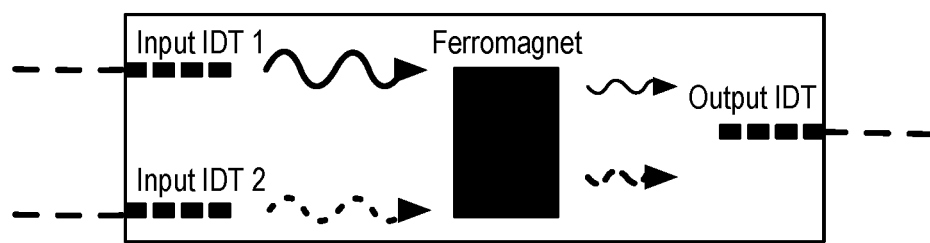

The complexity of "processing" required for the processing system to isolate sensor signals may be implementation specific. For example, in variations where each sensor has a distinct output, as shown in FIG. 6, each sensor signal may be trivially isolated and require little to no processing. In variations where each sensor functions at distinct frequency bandwidths, as shown in FIG. 11 (e.g., when input IDT 1 and input IDT 2 function generate SAWs at distinct bandwidths), the processing system may isolate the frequencies to determine sensor output. In another variation, for a single input wide band signal and a single output, as shown in FIG. 8, the processing system may digitize the single output signal and Fourier transform (e.g., FFT) the output signal to obtain a distinct output from each sensor (e.g., a single output signal for the two sensor outputs would be separated into two signals, one from each ferromagnetic). In another variation, sensor information may be isolated using time domains. For example, as shown in FIG. 11, each sensor may function at different times, the processing system may then isolate each sensor output using the time domain. The system may thus cycle input signals across the different sensors.

The processing system may additionally function to control sensor components and other system components, as necessary; and to "process" data acquired by system components. Additionally, particularly in active shielding variations, the processing system may be involved in active noise detection and filtering. Active noise detection and filtering may occur with or without sensor shielding components. Additionally shielding 140 components may be used to counteract detected noise components. For example, a field coil may be used to generate a magnetic field to counteract environmental field noise.

Depending on implementation, the processing system may enable certain operation mode variations. Operating modes, may comprise operation and processing of system components to improve sensor measurements, modify system power usage, improve system noise reduction (e.g., in conjunction with active shielding components), and calibrate the system for operation. Operating modes may be generally available or unique to particular system implementations. For example, active noise reduction modes may not be available for a system that does not include shielding 140.

The processing system may include a spatial averaging mode. The spatial averaging mode functions as a course graining implementation of the sensor data. In the spatial averaging mode, sensor nodes are grouped into clusters, wherein the sensor data is spatially averaged over each cluster. Course graining may reduce system noise and simplify the inverse problem by order of the cluster size, while sacrificing precision of the EM field profile. Dependent on the time scale of the evolution of the EM field, and other desired factors, the processing system may determine the level of course graining to be implemented for course graining. For example, the processing system may not implement a spatial averaging mode if the EM field evolves on the order of hours and is for a small heart patch comprising 500 sensor nodes; while alternatively, the processing system may implement a spatial averaging of cluster size 100 (e.g., for 10000 sensor nodes of a helmet) for an EM field that evolves on the order of milliseconds. In some implementations, a user/administrator may set the level of spatial averaging.

The processing system may additionally include an optimization mode. Through the optimization mode, the system may improve the signal to noise ratio (SNR), optimize field calculations, and/or speed up field calculations. The optimization mode may comprise a method to improve results over iterations of calculations. Through initial calculations, (e.g., initially using a coarse grained spatial averaging mode), the processing system may determine the sources and general profile of the EM field. In the optimization mode, through iterative calculations, the processing system may deactivate sensor nodes not significant (e.g., far from the source) to simplify and improve the field calculation, thereby reducing the number of sensor nodes utilized for an implementation. This in turn may reduce the level of required course graining (e.g., increasing precision) and reduce system noise from unnecessary sensor nodes.

The processing system may include a noise reduction mode of operation. The noise reduction mode functions to reduce noise. The noise reduction mode may include multiple implementations to reduce both external noise (e.g., magnetic field of the earth) and internal noise (e.g., system non-linearities). In one implementation, external noise may be reduced by subtracting the external field measured by an external magnetic sensor (e.g., by a field coil(s) situated near or around the set of sensors 120). This external sensor may be a magnetic sensor from the set of magnetic sensors 120, but may be a distinct magnetic sensor used for noise reduction. In an active noise reduction mode, the field coil generates a magnetic field to cancel out environmental fields in proximity of the set of sensors 120.

In another implementation, internal noise may be reduced by spatial averaging.

Figure 15:
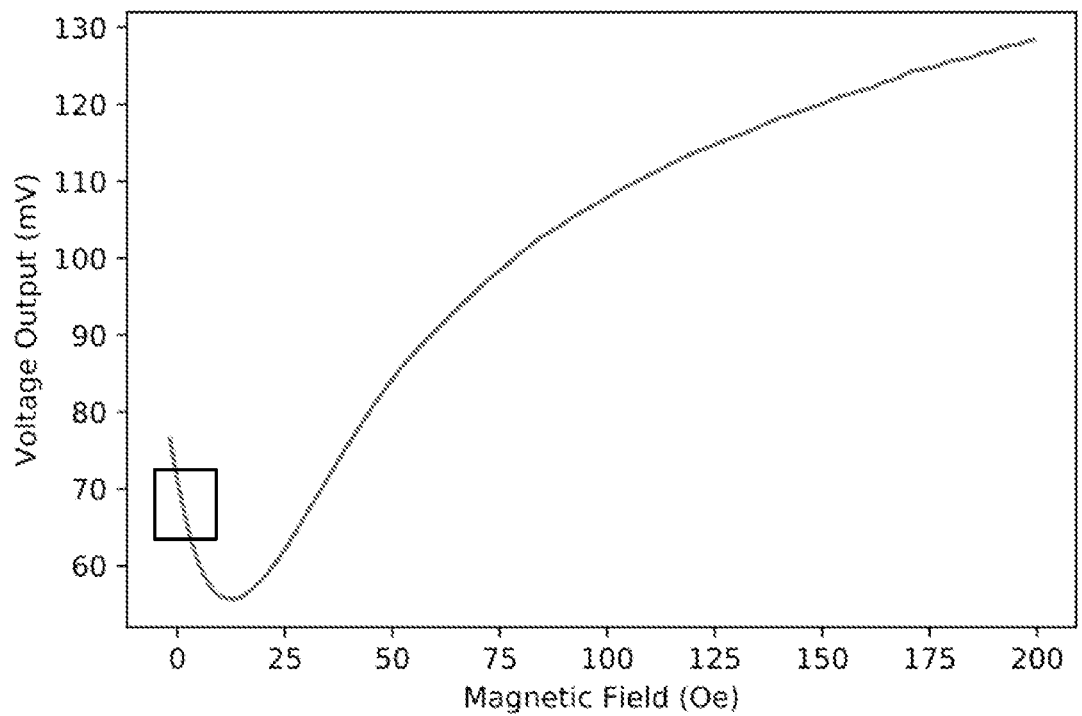
FIG. 15 is one example plot of the absorption spectrum of a ferromagnet as a function of applied field strength.

In a third implementation, inaccuracies (e.g., inaccuracies due to non-linearities) may be reduced by normalizing the detected field to a linear regime of the sensor (e.g., near zero), thereby reducing the noise of each sensor. Additionally, with this implementation, the system may include sensors that comprise linearizing circuitry. Linear circuitry sensors may be sensors from the set of magnetic sensors 120, or distinct sensors optimized for linearizing sensor data, thus enabling magnetic sensors to make "improved" field measurements at or near their linear regime, as seen in the graph in FIG. 15. Additionally, in variations that include a field coil, in a calibration operating mode the field coil generates a magnetic field to shift field measurements made by the set of sensors 120 to a linear regime of field measurements.

In another noise reduction implementation, the processing system may gather data from spatially clumped groups of sensor nodes at one time, while turning off sensor nodes near the spatially clumped group, thereby reducing sensor noise.

Figure 20:
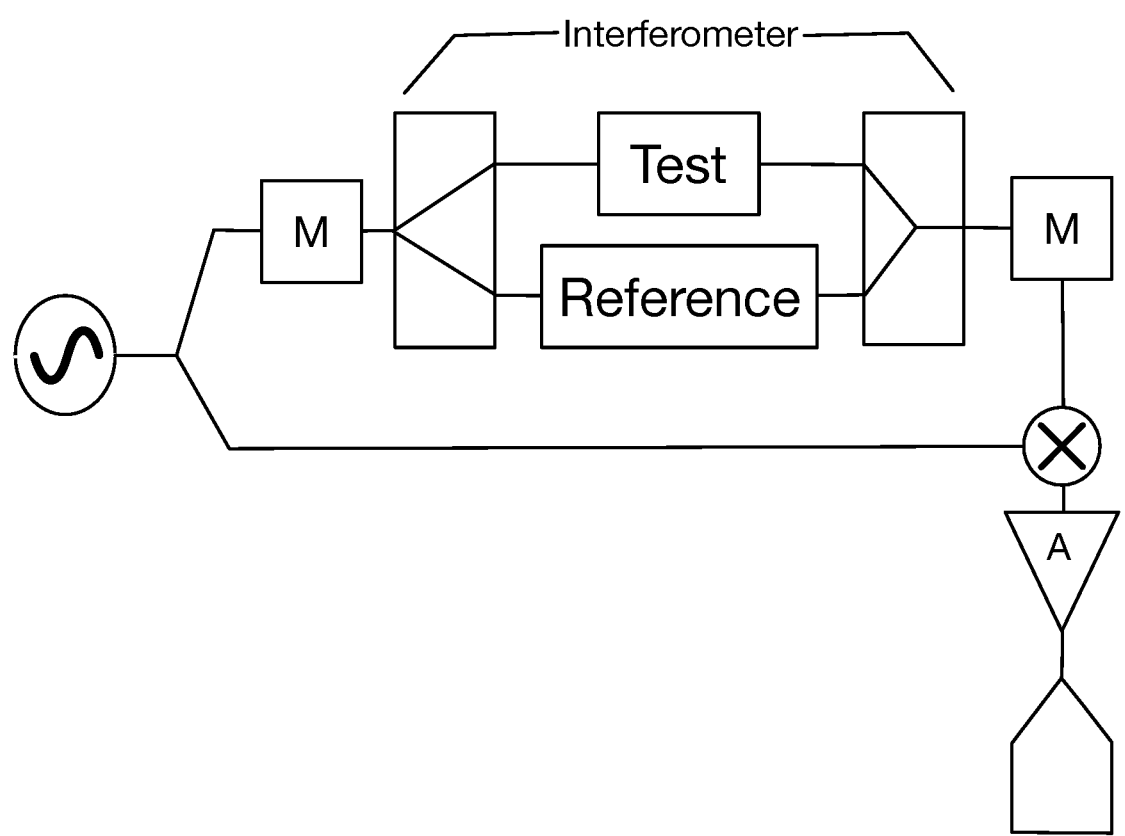
FIG. 20 is a schematic representation of a low energy interferometer system.

The processing system may include a low power operating mode. The low power operating mode may function to minimize the power usage of the system during operation. In some variations, the low power operating mode may be implemented in conjunction with a low power ADFMR sensor device, as shown in FIG. 20, but may alternatively be incorporated with any other system implementation. Low power operation may be particularly useful for extended use monitoring, particularly in implementations outside of a lab or clinic and other places far from an accessible power source. During a low power operating mode, the processing system may turn off sensors and other system components that are not necessary for function at a given time and may limit the rate of data acquisition as desired (e.g., one sensor measurement per minute). Low power operation may occur in different phases of operation and may differ in the type of operation. In some variations, the system may include an EM-localization low power operating mode. The EM-localization low power operating mode may function to identify the source of an EM field (e.g., identifying the locus of some brain activity). Low power mode may preferably function in conjunction with other operating modes.

In one implementation of the low power operating mode, the set of magnetic sensors 120 may be subdivided into clusters. The designation and positioning of sensors within these clusters may be implementation specific (e.g., evenly distributed around the head of a user for a VR helmet implementation of the system). During a low power operation mode, only one (or a designated number) of the sensors from each cluster may be active. That is, only a fraction of the magnetic sensors from the set of sensors is operating continuously.

The system may be actively switched between a low power mode and a fully active mode. Alternatively, the system may include triggers to automatically switch between the fully active mode and the low power mode. For example, in one variation once a trigger signal is identified by the processing system (e.g., when the active sensors receive, the system may then exit low power operating mode), the system may switch to a fully active operating mode. Additionally, in some variations for a system in a fully active operating mode, once the sensor activity falls below a certain threshold, the system may switch to a low power operating mode. These threshold measurements may be from measurements from the active sensors from the set of magnetic sensors 120 or may be a distinct implementation threshold signal. For example, in one implementation of the VR helmet, the system may include an inertial measurement unit (IMU). In this implementation detection of sufficient motion of the VR helmet may generate the threshold signal for the system to exit low power operating mode. Exemplary external sources of trigger signals could include IMUs, ECG sensor elements, pulse monitors, an external application (e.g., a computer application or game) and/or other sensor inputs or external systems.

The system may include a power source. In many variations the power source may comprise an electronic oscillator. The electronic oscillator functions to provide the system with an oscillating voltage, i.e., an alternating current (AC) power signal, wherein the power from the oscillator is used to activate the sensor circuit, i.e., the power source provides the signal input to the set of sensors 120. Alternatively, other types of oscillators may be used. The power source may be either directly, or indirectly, connected to the set of magnetic sensors 120. That is, the power source may be directly situated on the circuit base platform 110, directly coupled to the circuit base platform (e.g., battery connected to circuit base platform), or indirectly coupled to the circuit base platform (e.g., set of capacitors on the circuit base platform that are inductively charged). In some variations, the system may have multiple power sources, both situated on the circuit base platform 120 and off the circuit base platform.

Figure 33:
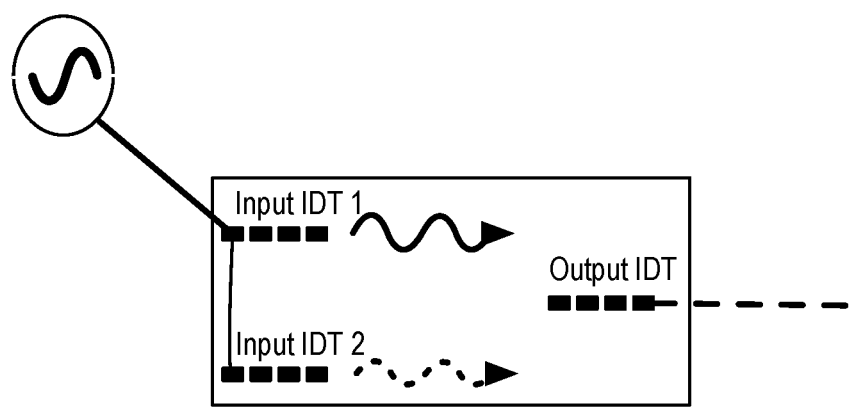
FIG. 33 is a schematic of a modified electronic oscillator.

As shown in FIG. 33, in some variations, an electronic oscillator may additionally include an input and output IDTs. The input and output IDTs incorporated with the electronic oscillator may function to narrow the oscillator bandwidth to only desired frequencies. That is, a broad RF signal (or even a noise signal) may be sent through an input IDT, wherein only the region near the resonance of the input IDT will be converted to a SAW that propagates across a piezoelectric substrate without any magnetic device (i.e., no ferromagnetic). Once the output IDT converts the SAW back to an RF signal, the signal may then be connected to an amplifier to generate a narrow RF signal to be used with the sensors. In some alternate versions, a ferromagnet may be included.

In some variations, the electronic oscillator is a voltage-controlled oscillator (VCO). In many variations, the frequency of the oscillator is in the order of gigahertz. High frequency pulsing of the oscillator may enable fast turn-on and turn-off times of the sensor. Fast turn-on/turn-off times may be on the order of microseconds or faster. As ADFMR sensor devices may function with MHz oscillations, the oscillator may alternatively be in any range that enables ADFMR functionality, that is in the order of MHz to GHz. For example, in one implementation fast turn on/turn-off times may be on the order of 10.0 μs. For example, in one implementation fast turn on/turn-off times may be on the order of 1.0 μs. In another implementation fast turn on/turn-off times may be on the order of 0.1 μs. In another implementation fast turn on/turn-off times may be on the order of 10 ns.

In some variations, multiple VCO's may be used in combination, which may be used if a single VCO can't generate all the desired frequencies. For example, an electric oscillator system may use a combination of a first VCO operating in first frequency range and a second VCO operating in a second frequency range, wherein the first and second VCOs generate combined frequencies across the desired range. Any suitable number of VCO's may be combined. The frequency range may be a continuous range but could alternatively be a combination of discrete ranges.

In variations that include ADFMR sensor devices, as input IDTs are activated by resonance frequency electric signals, the oscillator may regulate activation of the ADFMR sensor devices. Modulating the electronic oscillator or incorporate wide or narrowband frequencies may control the set of magnetic sensors 120. In some variations, assigning input IDT resonance bandwidths and frequency spacings may be implemented with the electronic oscillator to minimize EM interference.

In some ADFMR sensor device variations, the electronic oscillator may generate a frequency comb. The frequency comb comprises a range of frequencies spaced about a central carrier frequency. The frequency comb may help enable frequency domain isolation of the sensor output from the set of magnetic sensors 120. The frequency comb may be generated with, or without, an IDT pair to localize the frequency increments. In one example, a frequency comb is generated around a central carrier frequency of approximately 2200 MHz, comprising discrete frequencies between 2150-2250 MHz. In one implementation, the frequencies are spaced approximately 1 MHz apart. In another variation, to avoid overlap of harmonic frequencies, the frequencies are spaced approximately 3.5 MHz apart. Spacing by primes may be used in some variations (e.g., spacing with the prime 3,499,999 Hz)

In another variation, the frequencies are spaced approximately 5 MHz apart, such that input IDTs of ADFMR sensor devices may filter out unwanted signals. Increment spacings may be any desired spacing. Sufficient spacing between frequencies may enable ADFMR sensor devices IDTs to be positioned in parallel without any power dissipation or interference between the sensors. Sufficient spacing may additionally enable the set of magnetic sensors 120 to all function in parallel with no need for signal splitting.

The circuit system 130 may include intermediary components. The circuit system may include a mixer (i.e., frequency mixer (X)). In some variations, the mixer may be a single sideband (SSB) mixer. The mixer functions to combine two electrical signals into one, that is, the mixer may enable combining the signal outputs from the set of magnetic sensors 120. The mixer may multiply signals, enabling frequency mixing. Additionally, the mixer may enable mixing the original electronic oscillator signal with the sensor output to remove electronic oscillator noise.

In some variations, the mixer may bring down a ~1 GHz frequency from each sensor to a 0 frequency (i.e., DC). In one implementation of this variation, wherein the electronic oscillator generates a frequency comb, the signal chain may subtract a scaled version of the frequency comb. This scaled version may be determined by sending a split signal down a reference leg. This signal may then be subtracted from each sensor output before being mixed down.

In one variation, the mix down signal (input to the mixer local oscillator port) is offset (i.e., shifted slightly off-center), which may function to avoid aliasing and harmonics. For example, for the above frequency comb example range 2150-2250 with central carrier frequency 2200, the subtracted frequency may be shifted to 2200.5 MHz.

As another variation, if a frequency comb of different frequencies is set through several sensors, a mixer may multiply (i.e., "mix down") the various resulting signals. The resulting signals can then be extracted and associated with corresponding individual sensors. For example, a frequency comb sent through several ADFMR sensor devices may result in signals at 2001 MHz, 2003 MHz, and 2005 MHz. A 2000 MHz signal can be used to mix down the signals to 1 MHz, 3 MHz, and 5 MHz. These can be separated and mapped to corresponding sensors.

2. System for an ADFMR Sensor

Figure 16:
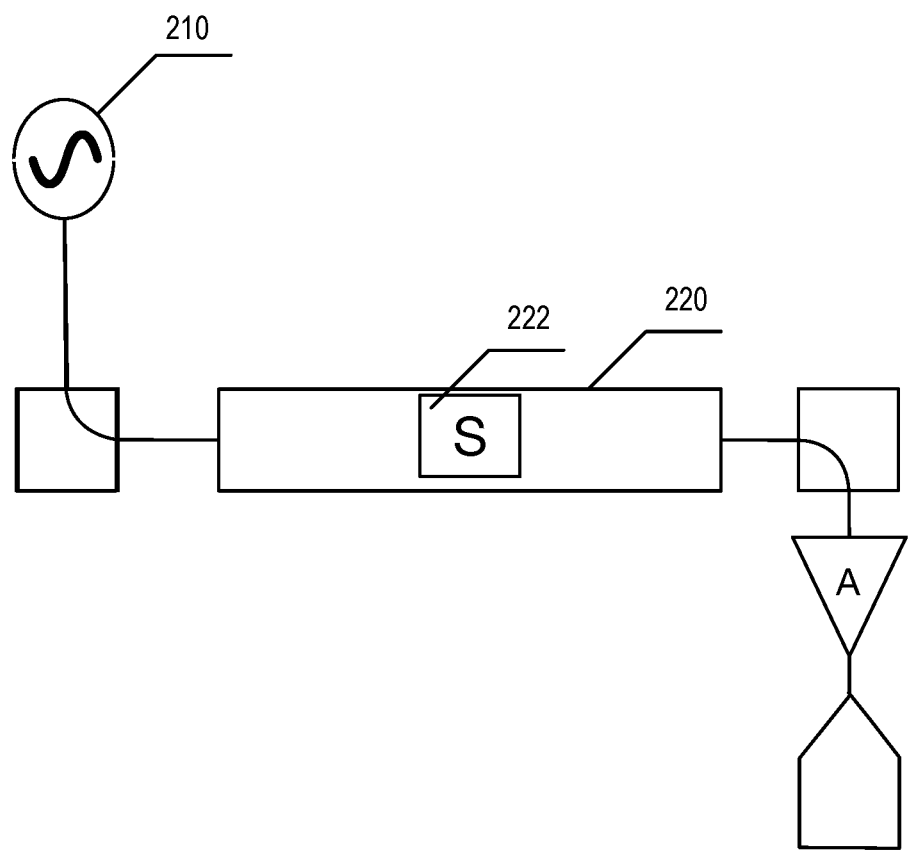
FIG. 16 is a simplified schematic representation of an ADFMR sensor device system.

The ADFMR sensor may comprise an acoustically driven ferromagnetic resonance (ADFMR) sensor device, as described in U.S. patent application Ser. No. 17/120,907, filed on 14 Dec. 2020 and which is hereby incorporated in its entirety by this reference. As shown in FIG. 16, an acoustically driven ferromagnetic resonance (ADFMR) based sensor includes: a power source 210, that provides an electrical signal to power the system; and an ADFMR circuit 220, i.e., a first "test" circuit, sensitive to electromagnetic fields, wherein the ADFMR circuit comprises an ADFMR device 222, and a detector circuit comprising an analog to digital converter. The ADFMR sensor functions as the ADFMR sensor described as part of the biological sensor array and ambient field array to detect and measure external electromagnetic (EM) fields by measuring a perturbation of the electrical signal through the ADFMR circuit due to the EM fields. In some preferred embodiments, the ADFMR sensor may include at least one additional circuit (e.g., an additional test circuit, or a reference circuit), wherein the system further includes at least one power splitter 232, wherein the power splitter splits the electric signal to the at least one circuit; and at least one power combiner 234, wherein the power combiner combines the potentially perturbed electric signal output from the ADFMR circuit 220 with other electrical signals.

Figure 17:
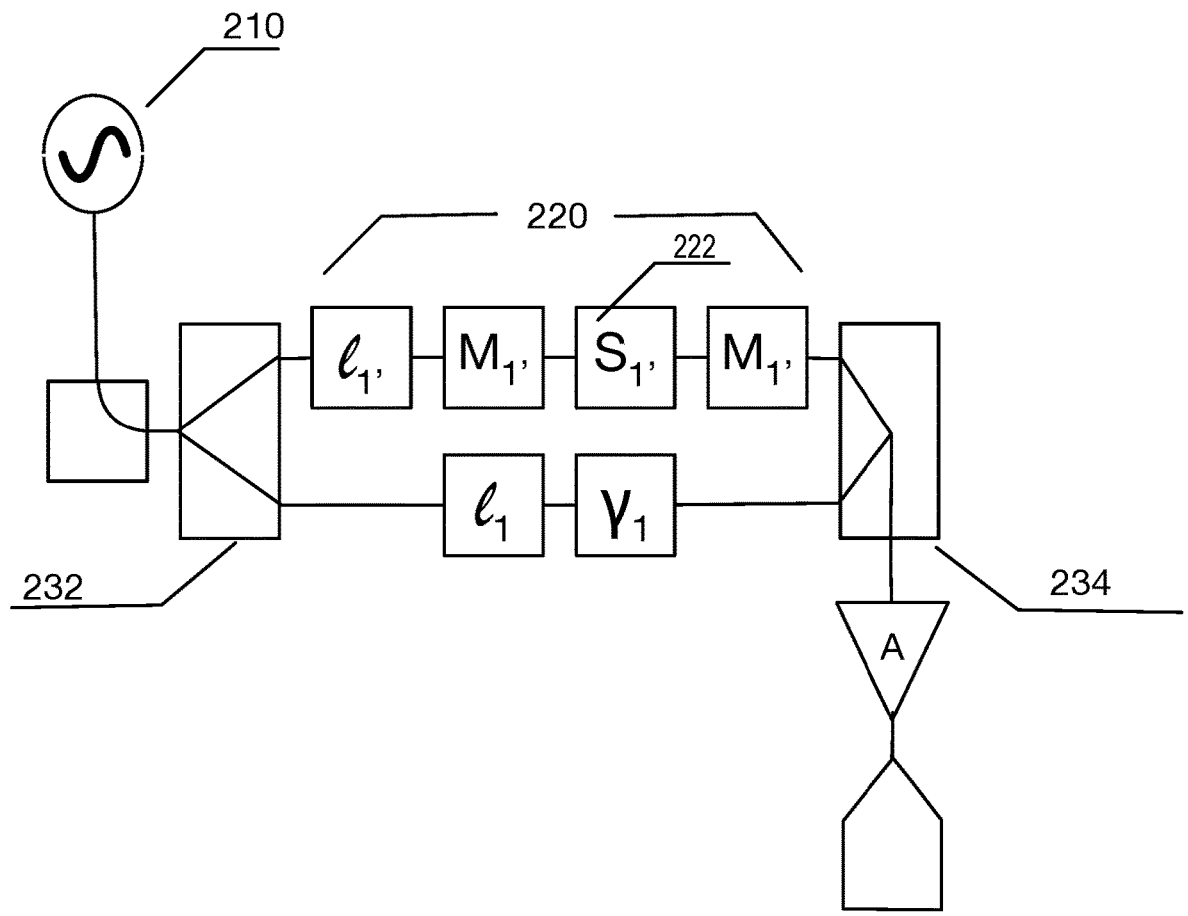
FIG. 17 is a schematic representation of an interferometer ADFMR sensor device.

In some variations that include at least one additional circuit, as shown in FIG. 17, the at least one additional circuit comprises a first signal processing circuit, wherein the first signal processing circuit is situated parallel to the ADFMR circuit 220 and functions as a "reference" to the ADFMR circuit. This system variation, i.e., interferometer variation, functions to detect and measure external electromagnetic (EM) fields by comparison of a perturbation of the electrical signal through the ADFMR circuit 220, as compared to the unperturbed electrical signal through the first signal processing circuit, i.e., a first reference circuit. That is, in the interferometer variations of the system, the power signal through the ADFMR circuit 220 is perturbed by an external field that is then interfered with an unperturbed reference signal from the reference circuit. The interference (e.g., destructive interference) profile between the test signal and the reference signal, may then be used by the detector circuit to determine the field strength.

Figure 18:
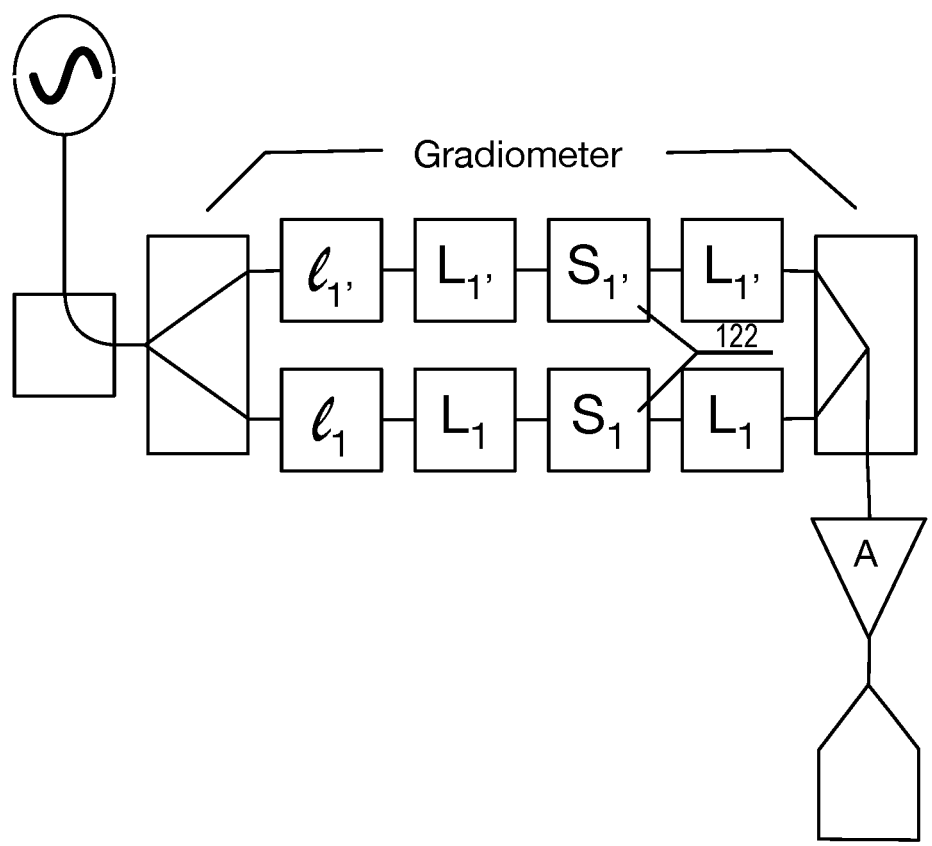
FIG. 18 is a schematic representation of a one-dimensional gradiometer ADFMR sensor device.

In another variation, as shown in FIG. 18, the system may function to measure the change (i.e., gradient) of external EM fields, i.e., function as a gradiometer. In gradiometer variations, the at least one circuit may comprise an additional ADFMR circuit 220, i.e., a second test circuit that is sensitive to EM fields. In this variation, the difference in measurement between the first test circuit and the second test circuit may be used to determine the gradient of the EM field. That is, in the gradiometer variations of the system, the power signal through both ADFMR circuits 220 are perturbed by the external field. By taking into account the positional dependence of the two circuits, measurement of the gradient of the field can be enabled through interference (e.g., destructive interference) measurements between the two signals.

Figure 19:
FIG. 19 is a glossary of example circuit subcomponents.
Figure 19:
Figure 19:

In many variations, the system may additionally, or alternatively, include subcomponents to increase and/or modify system capability. Examples include: additional ADFMR devices 222 (e.g., enabling multi-dimensional field measurements), amplifiers (e.g., to amplify the power/electrical signal), filters (e.g., to reduce internal and background noise), matching networks (e.g., to match the signal power between parallel circuits), attenuators, phase shifters (e.g., to alter interference patterns between test and reference signal), mixers (e.g., to mix signal frequency), magnetic field coils (e.g., to shift the signal band), and any other desired components. Examples of potential system subcomponents include: signal amplifiers (A), bandpass filters (F), attenuators (l), inductors (L), phase shifters ($\gamma$), couplers (c), mixers (X), matching networks (M), analog to digital converters (ADC), digital to analog converters (DAC), and comparators ($\geq$), logic circuits, and field coils. The system may include any other desired components as applicable. FIG. 19 includes a glossary of terms and symbols of subcomponents implemented in some variations of the system.

Figure 21:
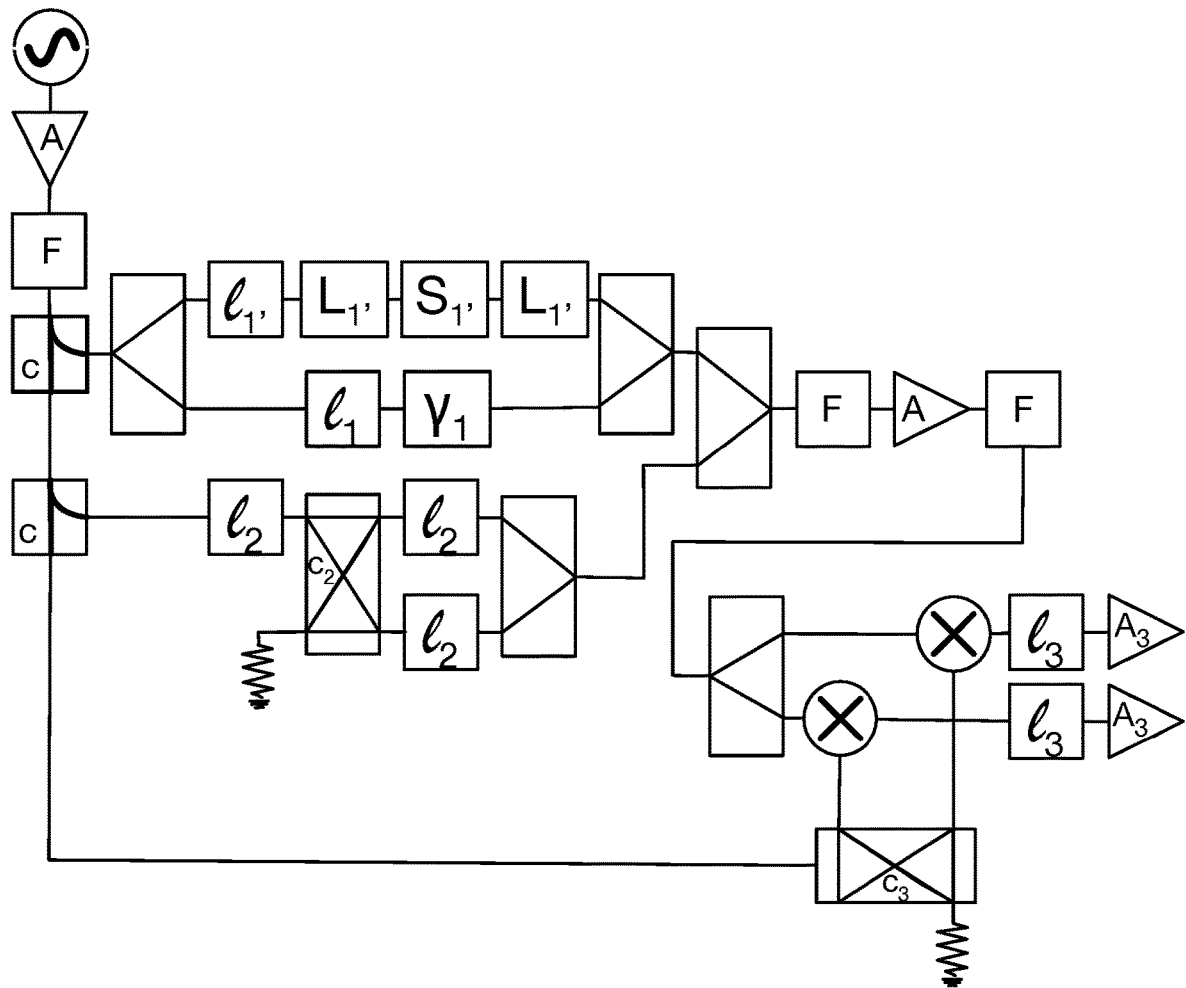
FIG. 21 is a schematic representation of an interferometer system that implements noise reduction.

These subcomponents may enable many additional variations. For example, the system may comprise: variations optimized for low energy consumption, as shown in one example in FIG. 20; variations to reduce noise, as shown in one example in FIG. 21 example; and variations that optimize the sensitivity and/or operating range of the system, as shown in one example in FIG. 22. The system may additionally, or alternatively, comprise any combination or additional variation, as desired.

The system may include circuits and circuit segments, parallel or in series, as part of the system. These circuits may contain any circuit subcomponents (e.g., the aforementioned subcomponents), as desired for functionality. As used in this section, the term "circuit" will be used generally, to refer to either an entire circuit, or a circuit segment. That is, a circuit will not necessarily form a closed loop per se, but with the combination of additional circuits, that may or may not be explicitly presented here, the circuit may function as part of a closed loop.

Figure 23:
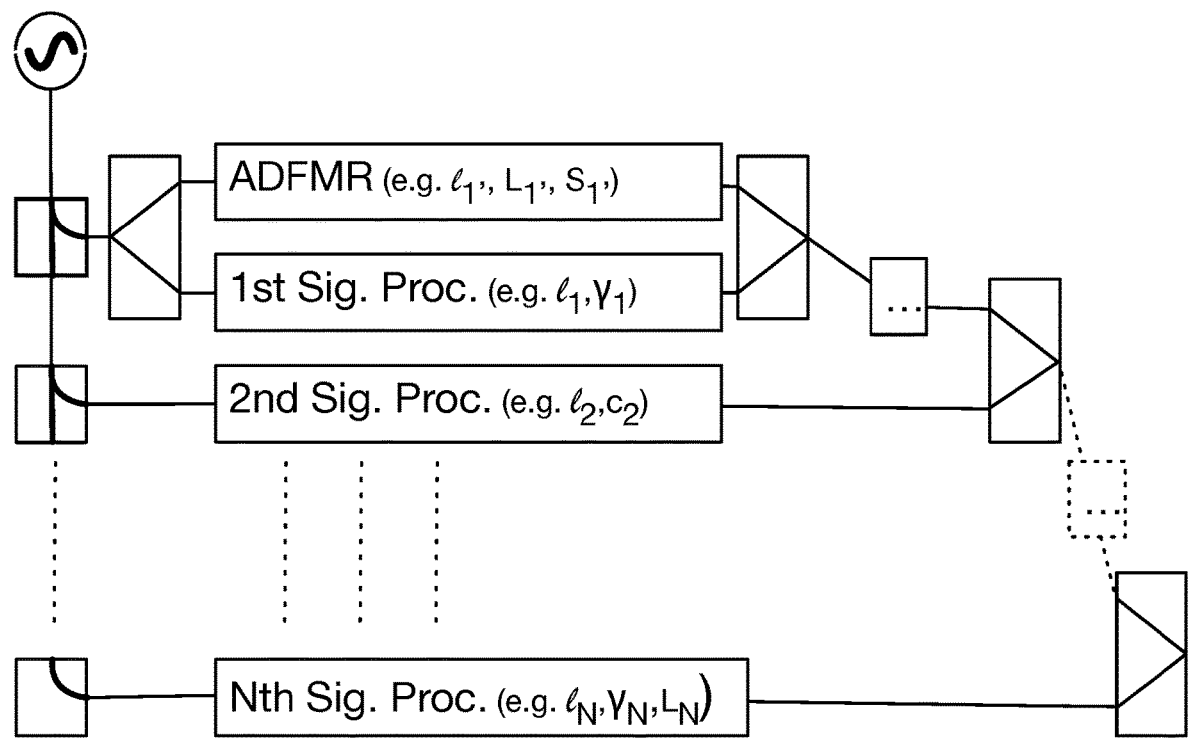
FIG. 23 is a general circuit schematic representation of an interferometer ADFMR sensor device.
Figure 24:
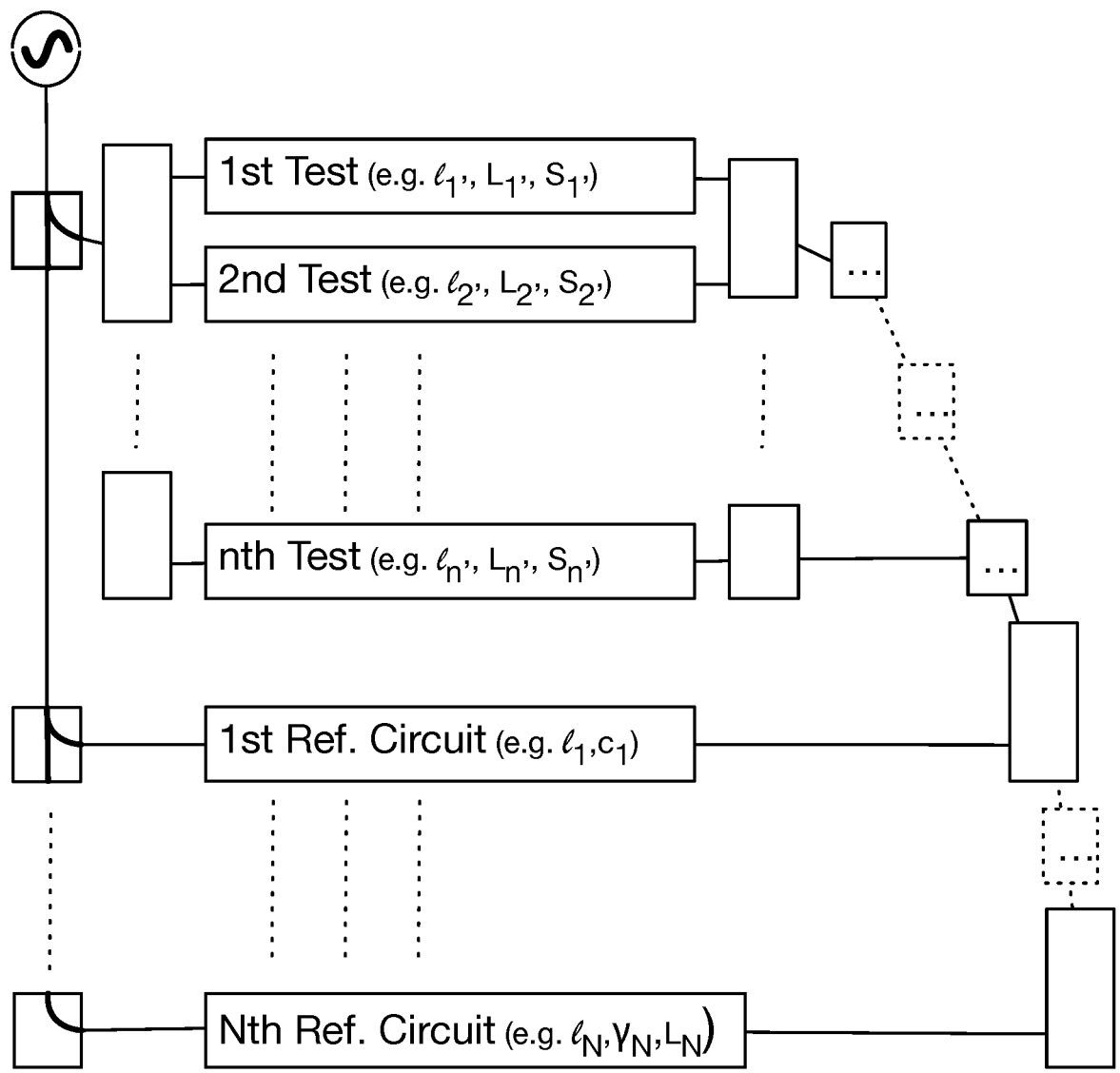
FIG. 24 is a general circuit schematic representation of the ADFMR sensor device.

As shown in FIG. 23 and FIG. 24, numbering for circuits refer to the number of test circuits (shown with primed subscript numbers), circuits that include an ADFMR device subcomponent; and signal processing circuits (shown with subscript numbers). Test circuits may also be referred to as ADFMR circuits or sensor circuits. Additionally, the first test circuit may also be referred to without a numbering, e.g., the test circuit, or the ADFMR circuit. Although circuits are shown numbered only in parallel in the figures, variations of the system may include that test circuits and/or signal processing circuits in other non-parallel configurations within the circuit.

In a general circuit layout of the system, as shown in FIG. 24, the system may comprise "n" test circuits and "N" signal processing circuits, wherein n and N are arbitrary whole numbers determined by the specific implementation. Circuit subcomponents, i.e., components on a specific circuit, may be referred to with a subscript referring to the circuit number, wherein primed subscripts will be used for test circuit subcomponents (e.g., $L_{2'}$ refers to an inductor on a second test circuit) and non-primed subscripts will be used for signal processing circuit subcomponents (e.g., $L_2$ refers to an inductor on a second signal processing circuit). In some variations, certain subcomponents may appear in regions where it is not clear which circuit these components belong to. These subcomponents may be included without any subscript or may include a subscript to connect it with a desired circuit (e.g., when the subcomponent has a complementary functionality with the desired circuit).

As part of a circuit designation, circuit subcomponents may be described as upstream or downstream in relation to each other. Herein, "upstream" and "downstream" are used to refer to the direction of power traveling through the circuit. That is, a subcomponent 'A' downstream from subcomponent 'B' would refer to a positionality where the power travels from subcomponent 'B' to subcomponent 'A', with or without other components in between. A subcomponent 'A' upstream from subcomponent 'B' would refer to a positionality where the power travels from subcomponent 'A' to subcomponent 'B', with or without other components in between.

A system may include a power source 210. The power source functions as an energy source, providing an electrical signal to the system. In some variations, the power source 210 is an electronic oscillator. The electronic oscillator functions to provide the system with an oscillating voltage, i.e., an alternating current (AC) power signal, wherein the power from the oscillator is used to activate the sensor circuit. Alternatively, other types of currents may be used, e.g., direct current (DC).

In some variations, the electronic oscillator is a voltage-controlled oscillator (VCO). Preferably the frequency of the oscillator is in the order of gigahertz. More preferably ~2 GHz. High frequency pulsing of the oscillator may enable fast turn-on and turn-off times of the sensor. Fast turn-on/turn-off times may be on the order of microseconds or faster. As the ADFMR device 222 may function with MHz oscillations, the oscillator may alternatively be in any range that enables ADFMR functionality, that is in the order of MHz to GHz.

The system may include at least one ADFMR circuit 220. The ADFMR circuit 220 functions as a "test" circuit that includes an ADFMR device which enables sensor activity for the system. The ADFMR circuit 220 may also be referred to as a sensor circuit or a test circuit. Dependent on the variation, the system may include one, or multiple, ADFMR circuits 220; wherein each ADFMR circuit may share ADFMR devices 222 between them, have a single ADFMR device, or have multiple ADFMR devices. In some variations, the system may include a set of ADFMR circuits. Multiple ADFMR circuits 220 may be used for gradient field measurements, multidimensional field measurements, and/or to improve field measurement precision (e.g., through overlapping measurements). ADFMR circuits 220 are positioned downstream of the power source 210, such that the electrical signal provided by the power source may be implemented as a test signal along the ADFMR circuits.

Figure 25:
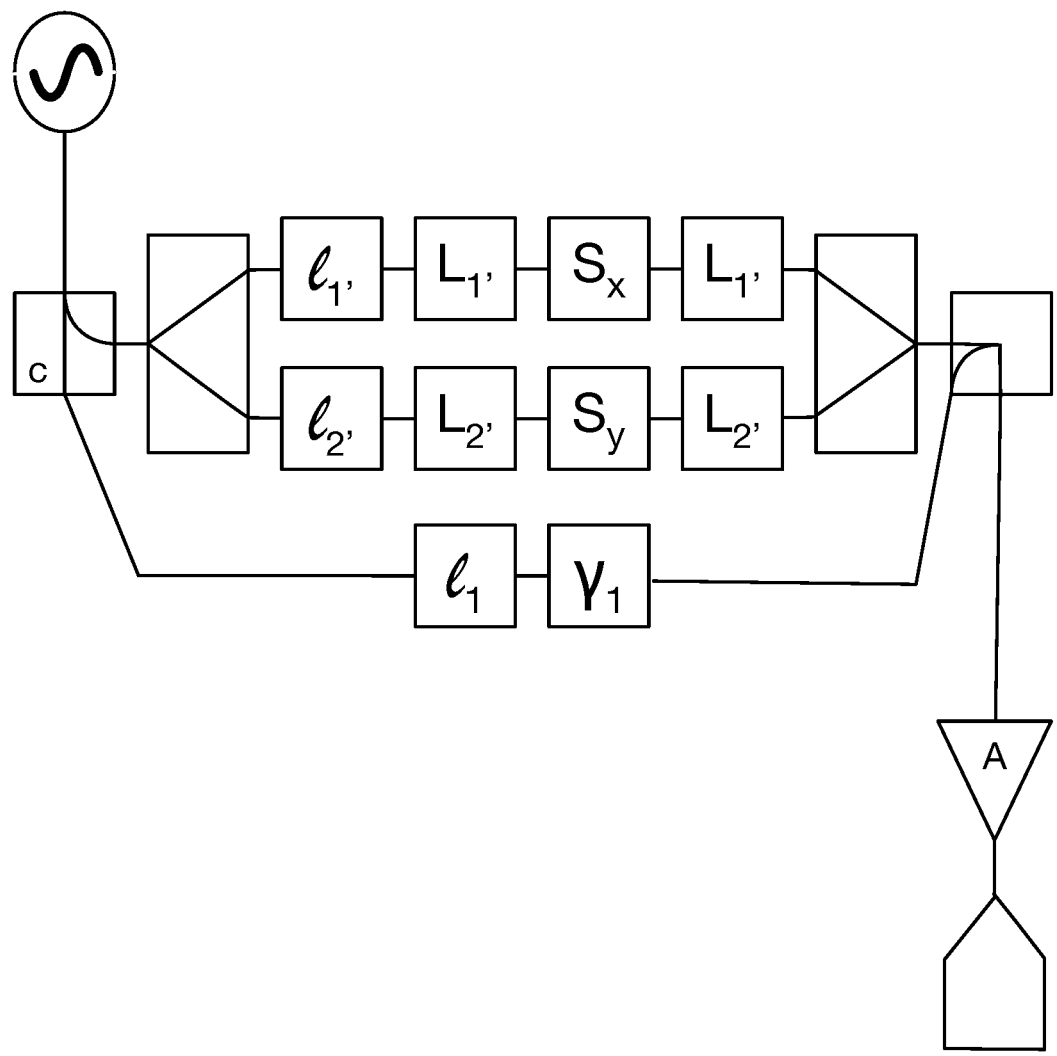
FIG. 25 is a schematic representation of a two-test circuit, two-dimensional interferometer ADFMR sensor device.
Figure 26:
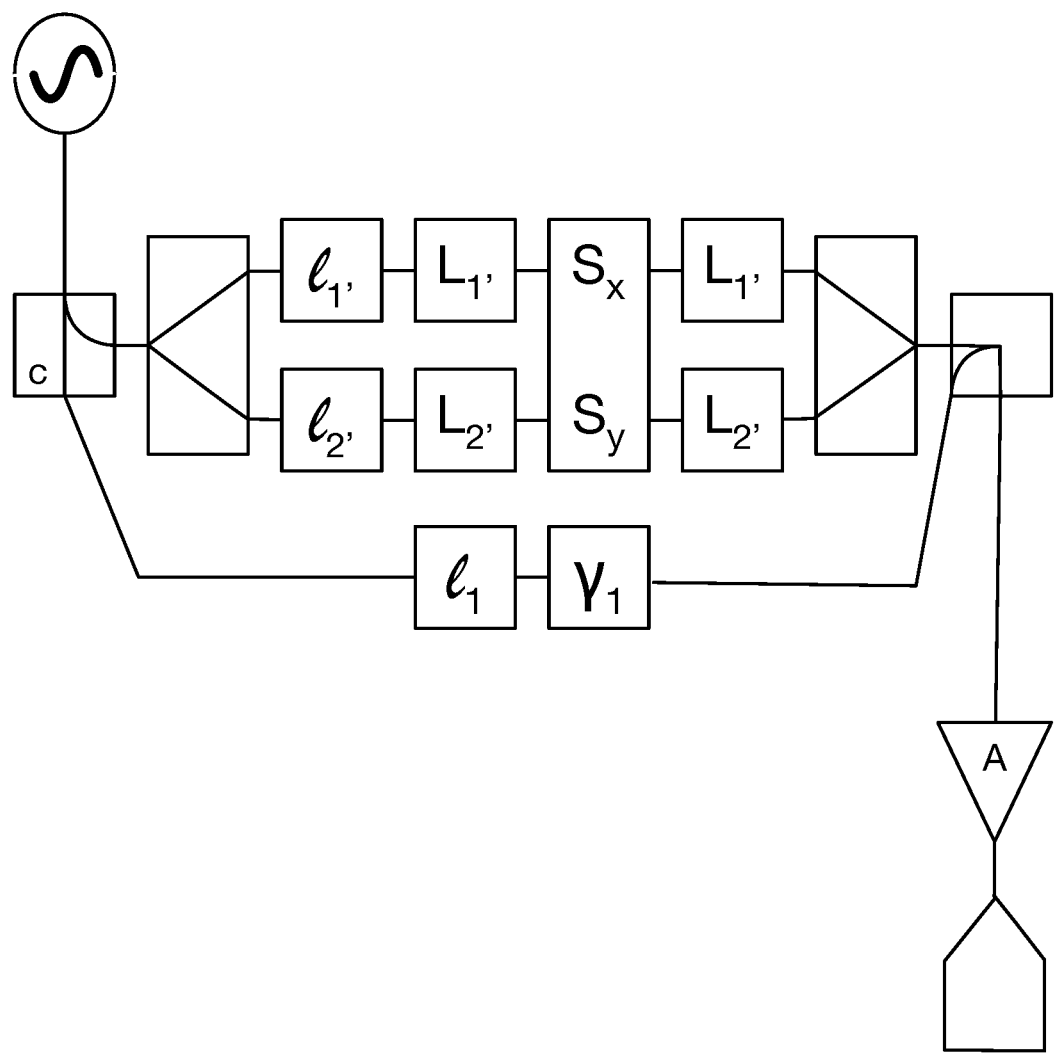
FIG. 26 is a second schematic representation of a two-test circuit, two-dimensional interferometer ADFMR sensor device.

In some variations, the system may comprise multiple ADFMR devices 222, distributed on ADFMR circuits 220, In one variation, multiple ADFMR circuits 220 measuring one, or multiple, dimensions may be implemented on a single chip, much similar to the layout as shown in FIG. 25 or FIG. 26. Dependent on the desired implementation, each dimensional functionality may be activated or deactivated.

Figure 27:
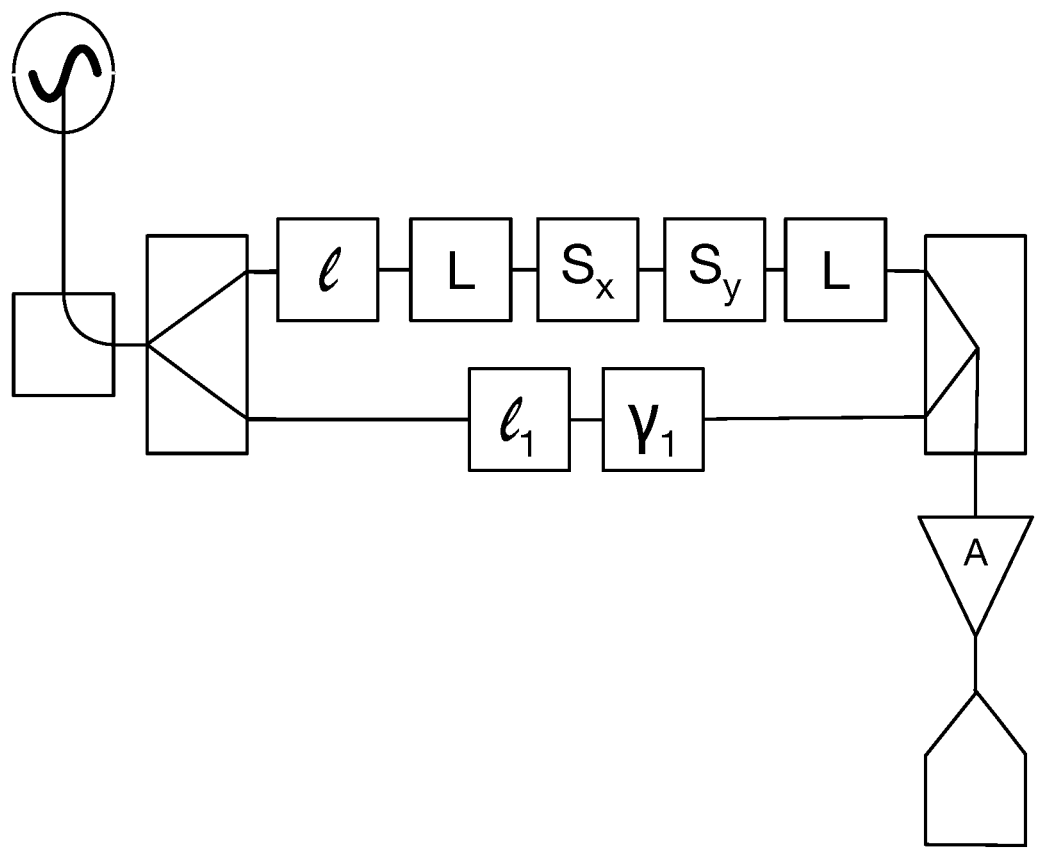
FIG. 27 is a schematic representation of a one-test circuit, two-dimensional interferometer ADFMR sensor device.

In one variation, a single ADMR circuit 220 measuring one, some, or all desired dimensionalities may be implemented on a single chip, much similar to the layout as shown in FIG. 27. Dependent on the desired implementation, each dimensional functionality may be activated or deactivated.

The ADFMR device 222 is preferably a component of the system, and additionally, a subcomponent of the ADFMR circuit 220. The ADFMR device 222 functions as a device that "measures" EM fields by enabling modification of a radio frequency (RF) carrier signal (i.e., the test signal) using acoustically driven magnetic resonance. In many variations, the magnetic resonance is implemented with a ferromagnetic (i.e., ferromagnetic resonance), but may be implemented with any magnetic material. Examples of other types of magnetic material include: anti-ferromagnets, ferrimagnets, etc. That is, although the device is referred to as an ADFMR device 222, the ADFMR device may actually be a, e.g., ferrimagnetic resonance device. The ADFMR device 222 may include: at least one acoustic transducer, that generates and/or absorbs acoustic waves; an acoustic resonator, that provides a medium for acoustic wave propagation; and a magnetic material, that perturbs the acoustic wave due to EM fields using magnetic resonance.

The ADFMR device 222 preferably includes an acoustic transducer. The acoustic transducer functions to convert the test signal to an acoustic wave, and/or convert the acoustic wave to an RF signal (e.g., an altered test signal). The acoustic transducer functions to generate and/or absorb acoustic waves (or pressure waves), from an electrical signal, that propagate along the acoustic resonator (e.g., piezoelectric substrate).

Preferably, the acoustic transducers are implemented in pairs, wherein one transducer generates the acoustic wave that then propagates to the other acoustic resonator that is then absorbed by the second transducer. That is, a first acoustic transducer converts the test signal traveling through the ADFMR circuit 220 into an acoustic wave; wherein the acoustic wave propagates in, or along, the ADFMR device 222 to a second acoustic transducer, which then converts the acoustic wave to an electrical signal. Alternatively, a single acoustic transducer may both convert the RF test signal to an acoustic wave, and the acoustic wave back into an RF signal. For example, an electrical signal may be converted into an acoustic wave by an acoustic transducer, the acoustic wave propagates out and is then reflected back to the acoustic transducer, which then converts the acoustic wave back into an electrical signal. In other examples, multiple acoustic transducers may be implemented both to generate and to absorb the acoustic waves. That is, multiple acoustic transducers may be implemented per ADFMR device 222, wherein a single, or multiple, RF signals may be converted to acoustic waves and/or acoustic waves converted to RF signals; once, or multiple times.

The acoustic transducer preferably generates an acoustic wave appropriate to the type of ADFMR device 222. Examples of generated acoustic may include: surface acoustic waves (SAWs), bulk acoustic waves (BAWs), and lamb waves. The specific acoustic transducer may be implementation specific. The type of acoustic transducer may be dependent on the electrical signal (e.g., signal frequency, signal power), and/or the type of acoustic wave generated (e.g., surface acoustic, bulk acoustic waves). For example, in variations wherein the system uses lamb waves, the acoustic transducer may comprise of electromagnet-acoustic transducers (EMAT). In variations wherein the system uses SAWs, the acoustic transducer may comprise interdigital transducers (IDTs). Alternatively, other types of transducers (e.g., film bulk acoustic resonators, high-overtone bulk acoustic resonators) may be implemented that either generate SAWs or other types of acoustic waves. The acoustic wave is preferably generated at, or near, the resonance frequency of the ferromagnet. The acoustic wave is preferably propagated in, or along, the acoustic resonator through the ferromagnet. Thus, the acoustic wave may enable the ferromagnet to function at, or near, resonance.

Figure 22:
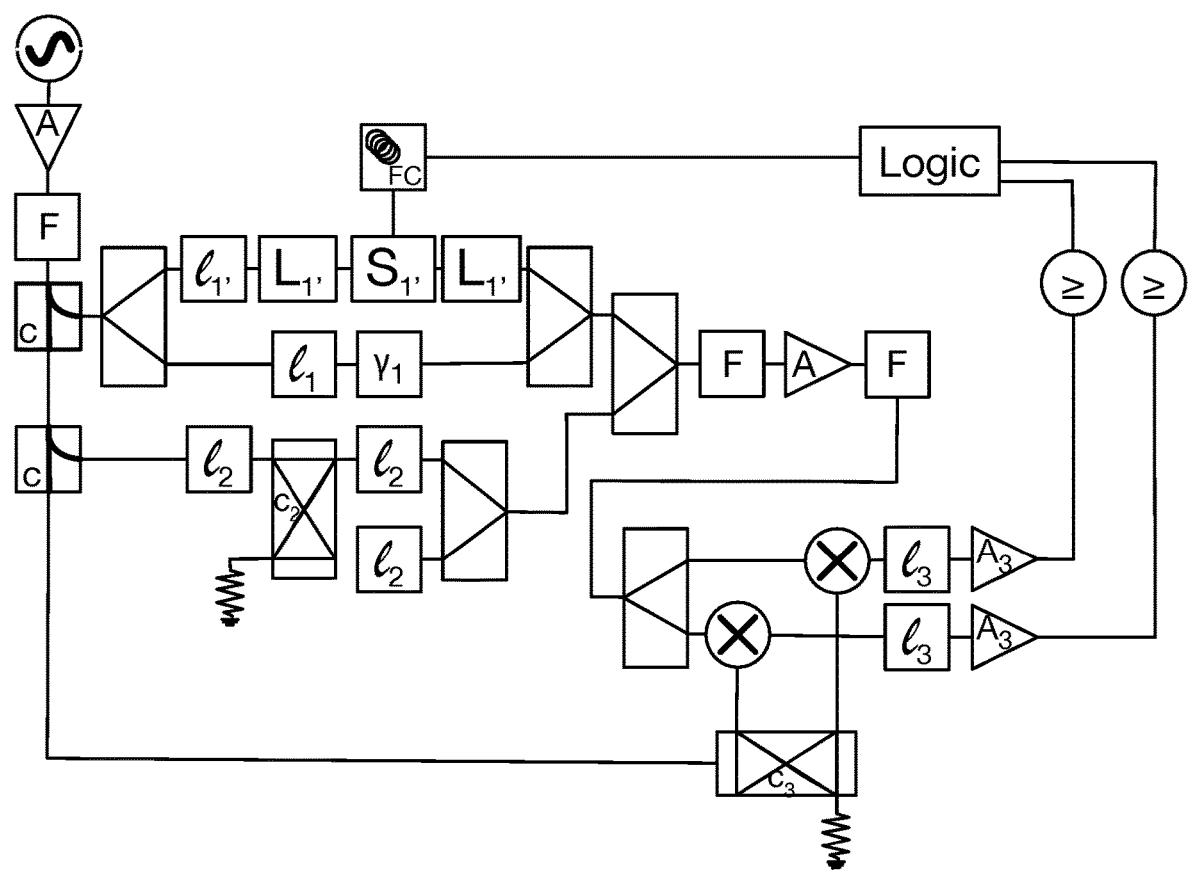
FIG. 22 is a schematic representation of a large disparity EM field interferometer.

In some variations wherein the system uses SAWs, the acoustic transducer may comprise an IDT. The IDT may function to generate a SAW from an electrical signal (or generate an electrical signal from a SAW) using the piezoelectric effect. The IDT is a device comprising of interlocking comb-shaped arrays of metallic electrodes, forming a periodic structure, positioned on a piezoelectric substrate (e.g., quartz, lithium niobate). The IDT may have any desired configuration/shape. One example IDT configuration is shown in FIG. 22. For the pairs of IDTs, preferably one functions as an input IDT and one functions as an output IDT. The input IDT may convert a radio frequency (RF) electrical signal to a surface acoustic wave (SAW) using the piezo-electric effect. The output IDT functions by absorbing the SAW and converting it back to an electrical signal.

The ADFMR device 222 may include an acoustic resonator. The acoustic resonator functions as a medium to enable propagation of acoustic waves. The acoustic resonator may enable wave propagation through a volume (e.g., BAWs), along the surface of a medium (e.g., SAWs), through the cavity of a medium (e.g., sound waves propagating through an air cavity of the acoustic resonator). The acoustic resonator may be composed of any material that enables the desired type of acoustic wave propagation. In some variations the acoustic resonator is composed of a piezoelectric substrate (e.g., quartz). In some variations, the acoustic resonator may comprise the main "body" of the ADFMR device 222, wherein all other components are situated on, or around, the acoustic resonator.

In some variations, the acoustic resonator is a piezoelectric substrate. The piezoelectric substrate enables formation and propagation of acoustic waves by the piezoelectric effect. The piezoelectric substrate may be composed of any desired piezoelectric compound (e.g., most crystal or ceramic compounds). In one preferred variation a Y-cut lithium niobate substrate is used as the piezoelectric substrate. In some variations that include two acoustic transducers, the length of space between the two acoustic transducers (i.e., delay line) is 1-3 mm. In one example, a piezoelectric substrate (e.g., zinc-oxide) is deposited underneath or above the two IDTs on the ADFMR base (e.g., diamond base material).

The ADFMR device 222 may include a magnetic material, preferably a magnetostrictive material. The magnetostrictive property may enable the magnetic material to convert strain into a change in magnetization or enable the conversion of a change in magnetization into strain. The only limitation on the magnetic material is that the magnetic material may achieve resonance on a macroscopic scale (i.e., resonance beyond the excitation of individual molecules and/or atoms). Examples of magnetic material include, ferromagnets, ferrimagnets, anti-ferromagnets, paramagnets, diamagnets, etc. In some variations, the magnetic material may comprise a ferromagnet, and/or a ferromagnetic mixture. The magnetic material functions to absorb acoustic waves, wherein at resonance the absorption is very sensitive to magnetic fields. Preferably, the magnetic material is positioned in the path of the acoustic wave (along the delay line), such that the local magnetic field sets the magnetic material's resonant frequency to, or close to, the acoustic wave frequency thereby enabling the magnetic material to effectively absorb the acoustic wave and thus change the propagating acoustic wave with respect to the magnitude of the field. In preferred variations, the ferromagnet is laid in between the two acoustic resonators (e.g., as a magnetic film), wherein the thickness and length of the magnetic material plays a significant role in absorption, thus the magnetic material may be of varying thickness and be of different length dependent on implementation. For ferromagnetic variations, examples of implemented types of ferromagnets include iron, nickel, and cobalt, but may be any suitable type of ferromagnet. In some variations, the system may be implemented with other magnetic materials, for example: paramagnets, diamagnets, ferrimagnets, anti-ferromagnets, or any combinations of these materials. Similar to the ferromagnet variation, the magnetic material may be implemented at or near resonance to absorb magnetic fields.

In some variations, the ferromagnetic has a spatial orientation. That is, the ferromagnetic may be built and oriented such that EM fields with one spatial orientation (e.g., x-direction) may affect the interaction between the magnet and the acoustic wave, wherein fields from other orientations may leave the ferromagnet unaffected. In this manner, dependent on implemented ferromagnet, the ferromagnet (and thus the ADFMR device 222) may be sensitive to one, two, or three spatial dimensions.

In some variations, the ADFMR device 222 may include a signal detector. The signal detector functions to measure the output power signal from the ADFMR device 222. Since the output power signal may have been perturbed by the applied field, the output power signal may be used to determine the field strength. The signal detector may additionally include noise reduction functionalities. In one variation, the signal detector may perform a Fourier transform to separate the desired output signal from other extraneous Electromagnetic (EM) waves. For example, an input acoustic transducer may additionally generate extraneous EM waves. The signal detector may perform a Fast Fourier Transform to isolate and remove these extraneous waves from the desired signal. Due to the time delay of acoustic wave propagation, as compared to EM wave propagation, other time dependent methods may be used to separate acoustic waves from EM waves. For example, in one implementation, the electronic oscillator may be cycled on and off for fixed periods of time, enabling measurement of the propagating acoustic waves during the electronic oscillator off cycle, thus potentially removing undesired signals.

Figure 28:
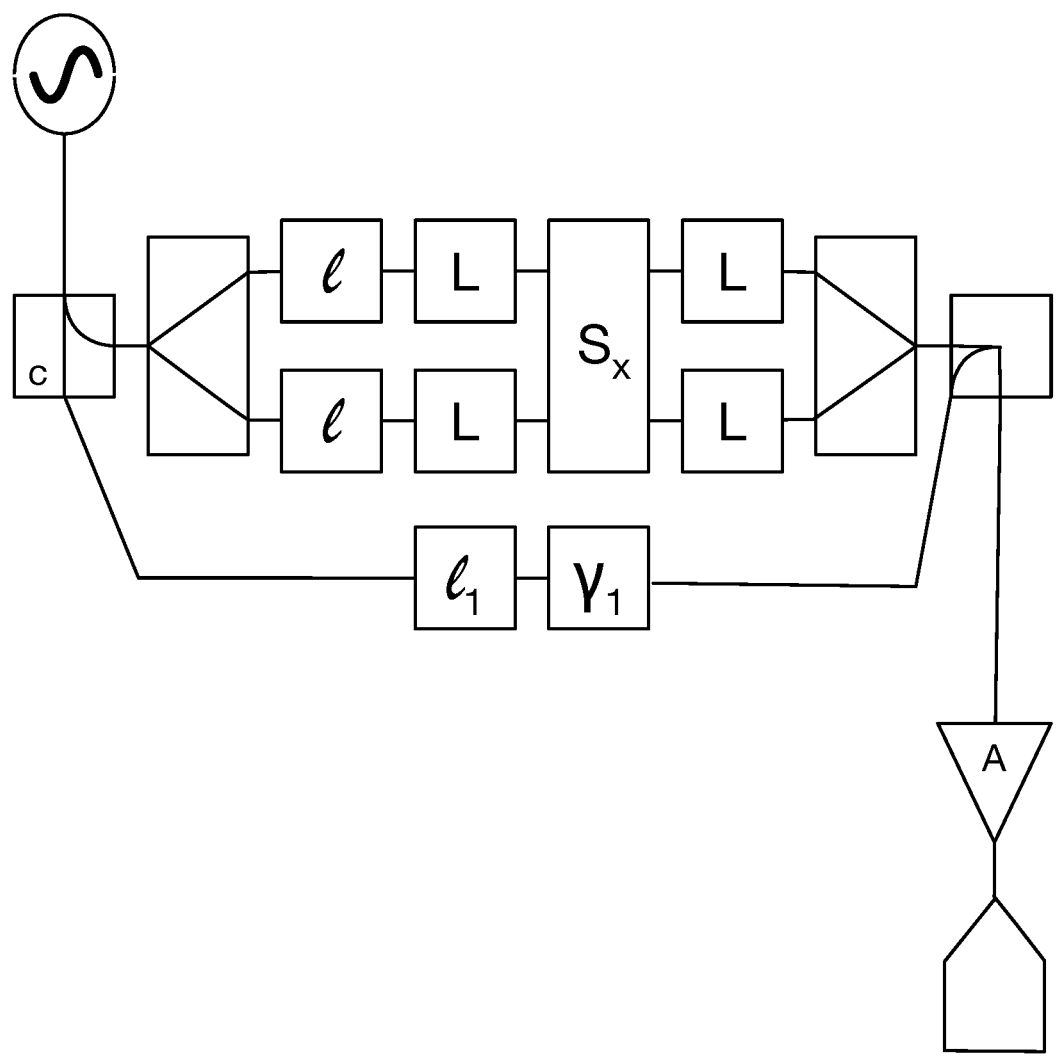
FIG. 28 is a schematic representation of a gradiometer ADFMR sensor device with a single SAW device.
Figure 29:
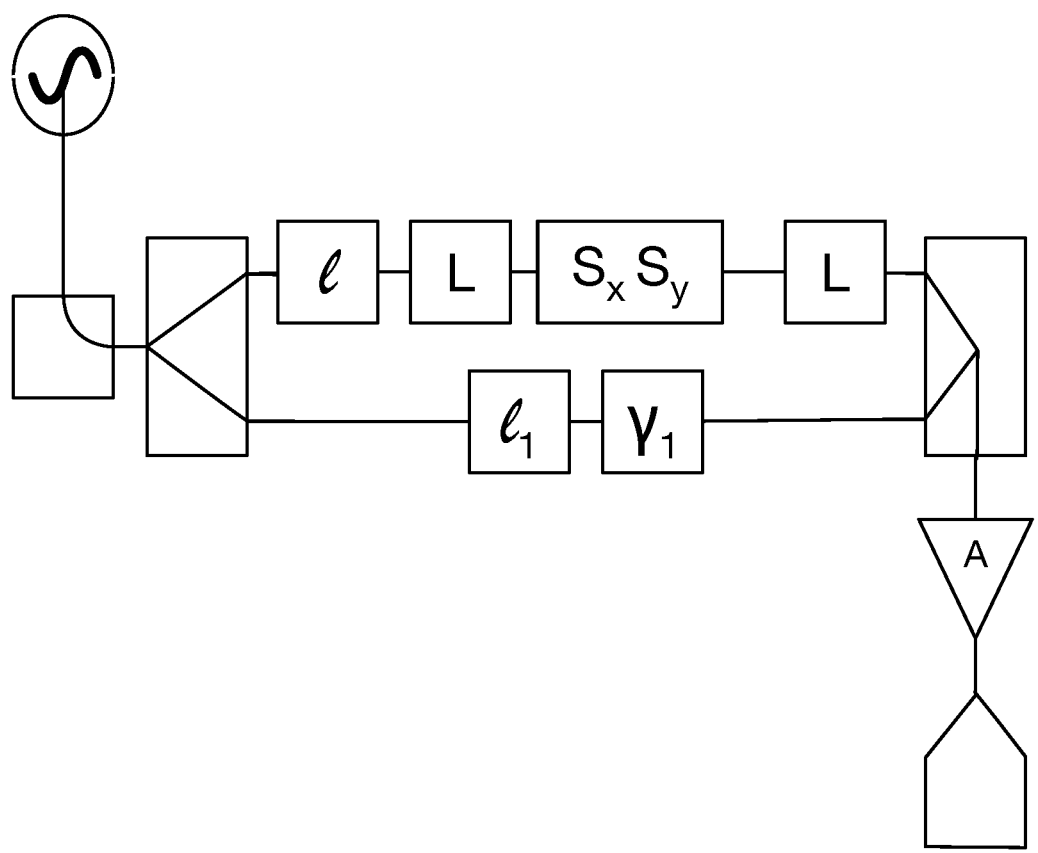
FIG. 29 is a schematic representation of a one-test circuit, two-dimensional interferometer ADFMR sensor device.

In some variations, the ADFMR device 222 may be a SAW device. That is, in one SAW device example, the ADFMR device 222 may comprise: two IDTs, an input IDT and an output IDT; positioned along a piezoelectric substrate; wherein a magnetic film is positioned along the piezoelectric substrate in between the two IDTs. Generally, the number of IDTs (input and output IDT), the number and type of magnetic film(s) and positioning on the piezoelectric substrate may be changed as described above. The specific configuration and shape of the SAW device may vary dependent on implementation. Example variations include: having a single SAW device per ADFMR circuit 220, having spatially oriented ferromagnets (one or more) on the SAW device, for a multidimensional field sensor, as shown in FIGS. 25-27; utilizing a single SAW device with a single ferromagnet between multiple ADFMR circuits 220, as shown in example FIG. 28; utilizing a single SAW device with multiple ferromagnets either as an interferometer or gradiometer implementation, as shown in example FIGS. 18, 25 and 29; having a single SAW device with multiple distinctly oriented ferromagnets in series (e.g., as part of a serial multi-dimensional sensor), as shown in FIG. 29, and having multiple SAW devices with multiple distinctly oriented ferromagnets in series (e.g., as part of a serial multi-dimensional sensor), as shown in example FIG. 27. Note, these example variations are not necessarily distinct and many example figures describe multiple variations. Specific variations may include fewer, or additional components, as desired or necessary.

In some variations, the ADFMR device 222 includes a field coil (FC). The field coil could be a direct current (DC) coil and/or any suitable coil or system for creating a magnetic field. Any other suitable component that can create a field to offset the power output may be used. The field coil functions to generate a magnetic field bias to positively or negatively offset the output of the ADFMR device 222. In one variation, the field coil reduces the power output by inducing a reduced external field that the ADFMR device 222 is exposed to. The field coil may be implemented to offset the power output to a small output regime wherein circuit components function linearly, thereby reducing systematic error to non-linearities. For example, an amplifier may have a much smaller range of linear amplification as compared to the ADFMR device 222 output. Reducing the range of the sensor output would thus enable linear functionality of the amplifier. The field coil could potentially apply a magnetic field at any frequency (or combination of frequencies) as needed. For example, if the system were exposed to a large unwanted signal from power lines (e.g., 60 Hz) in addition to the Earth's field, the unwanted power line alternating field as well as the Earth's field could be cancelled out. The field coil may be used to apply any suitable type of canceling magnetic field.

The field coil may offset the power output to any desired range. In some variations, the field coil may offset the external field to near zero. In other variations, the field coil may alternatively, or additionally, offset the magnetic field to a range where the ADFMR sensor functions optimally. For example, in implementations where the system is used as a gradiometer, the field coil may offset the magnetic field to the regime where a change in the external field would lead to the largest change in power output (e.g., inflection point of the output power spectra).

The system may include a detector circuit. The detector circuit functions to take the output of the ADFMR circuits 220 (i.e., the potentially perturbed electrical signal), and any other components, and determine the EM field strength. In many variations the detector circuit comprises an analog to digital converter (ADC). An ADC functions to convert an analog signal to a digital signal. In some variations, the ADC may be utilized to convert the output signal to a digital signal for analysis. In some variations, ADCs may be implemented for each circuit (including the ADFMR circuit 220). In these variations the ADC converts the signal output of the circuit into a digital output prior to combining the circuit signals. All circuit digital outputs may then be combined to a digital output signal.

In variations that include parallel circuits, the system may additionally include power splitters 232 and/or power combiners 234. The power splitter 232 functions to split the power signal into multiple parts, enabling the connection of an additional parallel circuit component; and the power combiner 234 functions to combine multiple circuits. In many variations, the power splitter 232 enables splitting the original power signal into a test signal and a reference signal. Additionally, or alternatively, the power splitter 232 may split the power signal into multiple test signals and/or multiple reference signals. In addition to other properties, the power splitter/combiner set enables the functionality of an interferometer for field measurement. That is, a power signal may be split into two parts (e.g., test and reference signal), wherein one (or both) signals may be altered (e.g., through power absorption of a field through the ADFMR device). The field may then be measured by examining the interference pattern generated once the two signals are combined. The system may include a pair of power splitter/combiners for each parallel circuit included in the system. Alternatively, the system may include more, or fewer, power splitter/combiner pairs for each parallel circuit included in the system. In some variations, the system may include an unequal number of power splitters 232 and power combiners 234 (e.g., one split power signal may be connected to a ground and not require a power combiner).

For some multi-dimensional implementations field detection, the system may include additional power splitters/combiners to enable the addition of ADFMR circuits 220. For example, for an implementation enabling measurement of fields in a plane, the system may include a power splitter 232 that splits the circuit into a first test circuit and a second test circuit; and a power combiner 234 that combines the first ADFMR circuit 220, that measures the field in an "x-direction", and a second ADFMR circuit, that measures the field in a "y-direction". The system may additionally have a second pair of power splitters/combiners (instead of the shown couplers), wherein the power signal is initially split into a reference signal and a test signal. Alternatively, a single test circuit may have multiple ADFMR devices 222 in series (e.g., with different orientations), such that their orientation enables measurement of the field in multiple dimensions. In some variations, these ADFMR sensors in series may function simultaneously, wherein other variations they may alternate.

As discussed previously, the system may additionally include a combination of various subcomponents. Example subcomponents include: signal amplifiers, bandpass filters, attenuators, inductors, phase shifters, couplers, mixers, matching networks, field coils, and comparators. Subcomponents may be incorporated on test circuits, signal processing circuits, or on any other part of the system as desired.

In some variations, the system includes at least one amplifier (A). An amplifier functions to increase the signal strength. The amplifier may help counteract the effects of power dissipation and reduced power due to splitting the original power. The amplifier may be an active or passive amplifier.

In some variations, the system may include attenuators (l). An attenuator functions to reduce the power of the signal without affecting the signal waveform. In some variations, attenuators are implemented to reduce noise. Additionally, the attenuators may match the power signal amplitude between parallel circuits (e.g., between a test circuit and a reference circuit). Attenuators may be digital or analog. In some variations digital attenuators are used to maximize removal of 1/f "pink" noise, noise proportional to the power. Analog attenuators also reduce 1/f noise, but are dependent on the noise signal of their control voltage. In some variations, the ADFMR circuit 220 may include an attenuator.

In some variations, the system includes at least one bandpass filter (F). A bandpass filter functions by narrowing the electrical signal band, thereby enabling a narrower wave band for application and/or analysis. This may additionally be the case once a signal is amplified which may naturally broaden signal spectrum.

In some variations, the system includes at least one inductor (L). An inductor functions to store energy in a magnetic field. Matching inductors may match the impedance of the transducer to any circuit component adjacent to the transducer. In some variations, the system may include matching inductors that match acoustic transducers to mixer input.

In some variations, the system includes at least one phase shifter (y). The phase shifter function by "shifting" the phase of the electrical signal. The phase shifter may be implemented to apply constructive or destructive interference between parallel circuits that are then combined. This is particularly important in implementing an interferometer.

In some variations, the system may include at least one mixer (i.e. frequency mixer (X)). The mixer functions to combine two electrical signals into one. The mixer may multiply signals enabling frequency mixing. In some variations, the mixer may bring down a ~1 Ghz frequency from the ADFMR device 222 to a 0 frequency DC. Additionally, the mixer may enable mixing the original power source 210 signal with the ADFMR device 222 output to remove electronic oscillator noise.

In some variations, the system includes at least one coupler. A coupler functions by coupling power travelling through one circuit to another circuit, enabling the same signal to be used in another circuit. In some variations the coupler may be used instead of a power splitter to maintain the same level of power in both paths. In some variations, the system may additionally include a hybrid coupler. The hybrid coupler enables coupling two input sources to two output sources. In some preferred variations, the hybrid coupler is implemented two split a single input source and shift the phase of the output sources.

In some variations, the system includes at least one matching network. The matching network may comprise a combination of inductors and capacitors. The matching network may function to both make an impedance match between the acoustic transducer and adjacent circuit components (e.g., mixer input) and allow the transducer impedance to appear high such that it can be attached to a high-efficiency (low power) oscillator. In some variations, matching networks may match the impedance of the transducer to any circuit component adjacent to the transducer. In some variations, the system may include matching networks that match acoustic transducers to mixer input.

In some variations, the system includes at least one comparator (≥). The comparator functions to detect the sign of the output signal, i.e., positive, negative, or zero. The comparator may be used with a logic circuit, to enable incremental changes to the output signal.

As mentioned previously, the system includes at least one ADFMR circuit 220 (i.e., a first ADFMR circuit), comprising, at least, one ADFMR device 222; wherein each ADFMR circuit includes an ADFMR device subcomponent and/or shares an ADFMR device subcomponent with other ADFMR circuits The ADFMR circuit 220 functions to measure the external magnetic field. Dependent on variation, each ADFMR circuit 220 may be identical or distinct. The ADFMR circuit 220 may have additional subcomponents depending on implementation. For example, in one implementation, the ADFMR circuit 220 may include matching networks. In other variations, the ADFMR circuit 220 may include inductors and/or attenuators. The ADFMR circuit 220 may additionally or alternatively have other components, such as an amplifier or a phase shifter.

Figure 35:
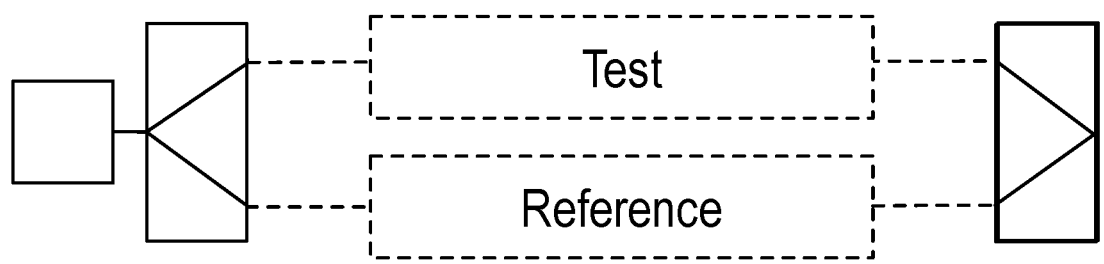
FIG. 35 is a schematic template for a single test circuit and a single reference circuit.
Figure 36:
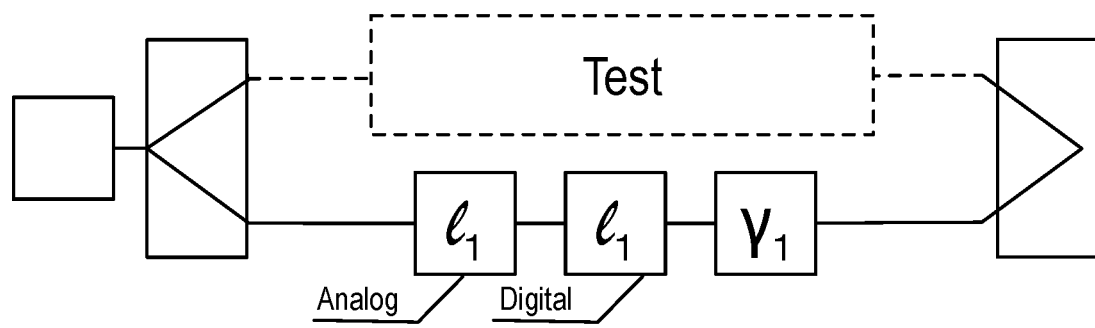
FIGS. 36-38 are example schematics for circuit components that may be included within a reference circuit.
Figure 37:
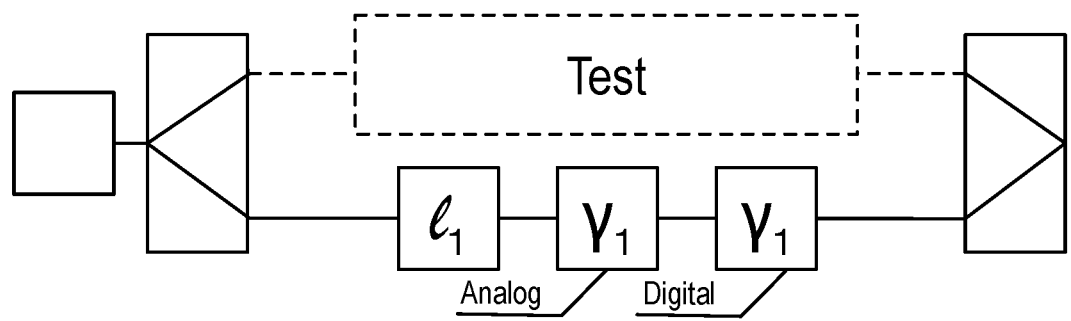
Figure 38:
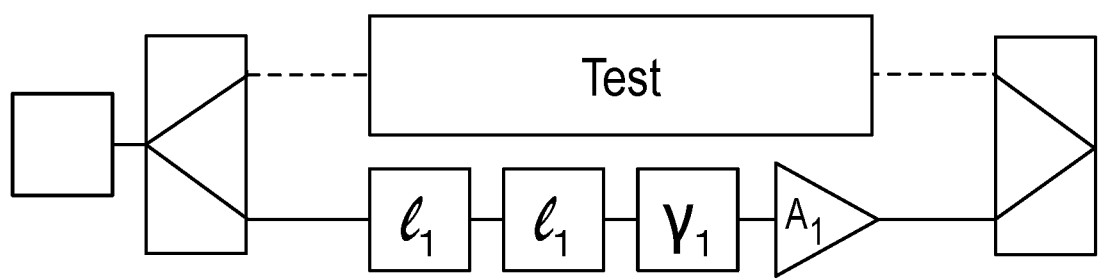
Figure 39:
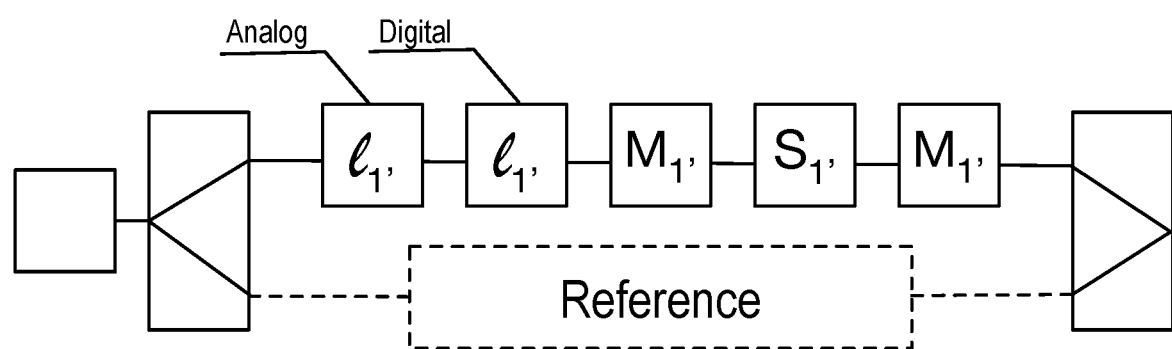
FIGS. 39-41 are example schematics for circuit components that may be included within a test circuit.
Figure 40:
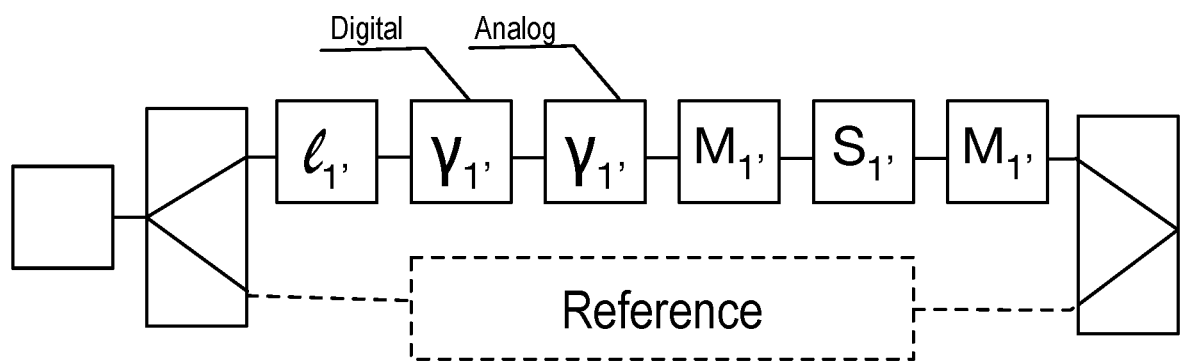
Figure 41:
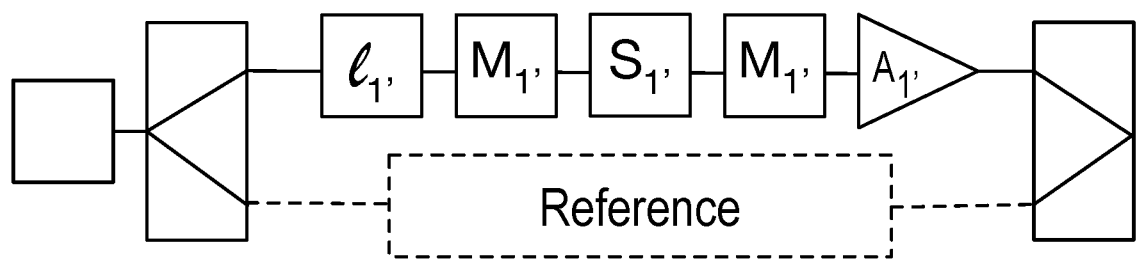

FIG. 35 shows a schematic template for a simplified interferometer. FIGS. 36-38 show sample variations of circuit component that may be incorporated as part of the reference circuit. These circuit components may be added/removed, or switched, as desired. In certain variations, two attenuators and/or phase shifters are included within the circuit. In these variations, one attenuator/phase shifter may be a digital attenuator, enabling only discrete step changes; whereas the other attenuator/phase shifter may be analog, enabling continuous change in value. FIGS. 39-41 show sample variations of circuit component that may be incorporated as part of the test circuit. These circuit components may be added/removed, or switched, as desired. In certain variations, two attenuators and/or phase shifters are included within the circuit. In these variations, one attenuator/phase shifter may be a digital attenuator, enabling only discrete step changes, whereas the other attenuator/phase shifter may be analog, enabling continuous change in value.

In one "low-power" variations the ADFMR circuit 220 includes a matching network. In this variation, the matching network may function to match the impedance of the ADFMR circuit with another circuit. In this variation, the system may include a high-impedance power source (e.g., oscillator), and the acoustic transducers of the ADFMR device may be lower-impedance.

In one lower power example, as shown in FIG. 20, the ADFMR sensor may include only a mixer and a detection circuit. The low power example functions in detecting fields at very low power consumption (less than 25 µW). In variations wherein the ADFMR device comprises a SAW device, the system may additionally include a matching network prior to the interferometer and after the interferometer. The matching network may provide high resistance and match the IDT impedance to the electronic oscillator and mixer impedance, thereby matching their voltages.

Figure 30:
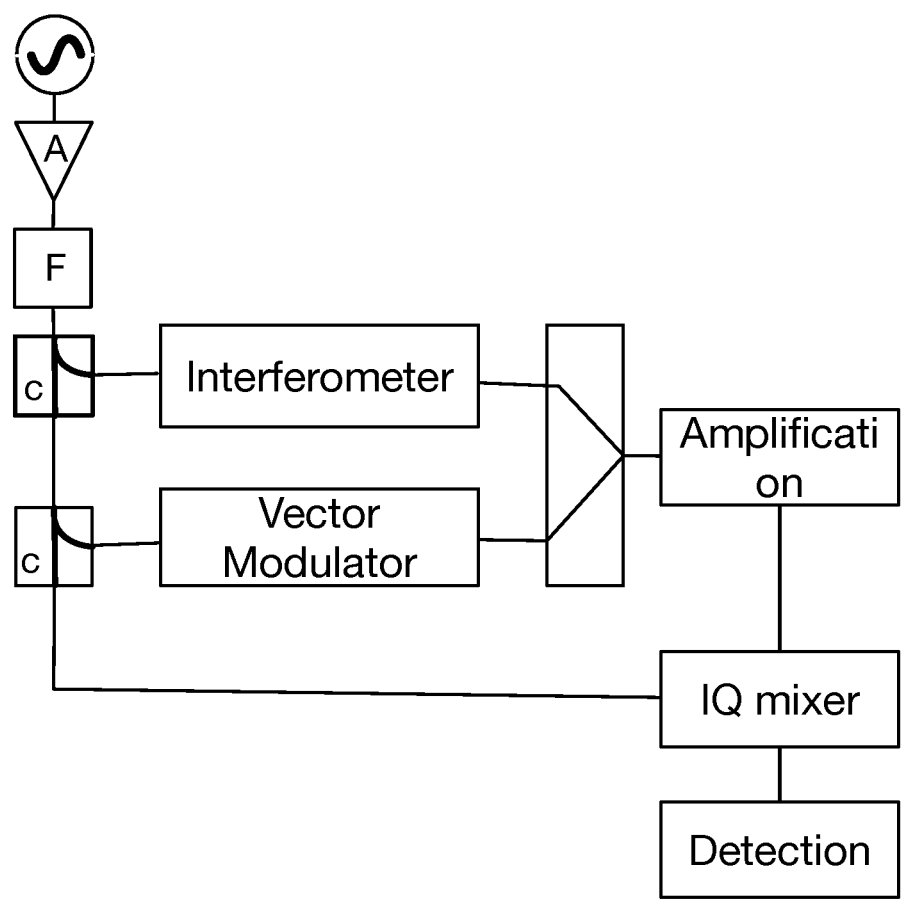
FIG. 30 is a schematic for a circuit representation of an interferometer with a vector modulator circuit.

In one general interferometer application example, as shown in FIG. 30, the interferometer additionally includes a vector modulator circuit, an IQ mixer circuit, an amplification circuit, and a detection circuit. In this example, the amplification circuit amplifies the output of the "inner" interferometer and an "outer" interferometer, vector modulator circuit, which then connect to an IQ mixer circuit. All signals eventually combine and are output to the detection circuit. The general application example functions to measure fields as desired. This example may be additionally or alternatively implemented for a gradiometer system.

Figure 31:
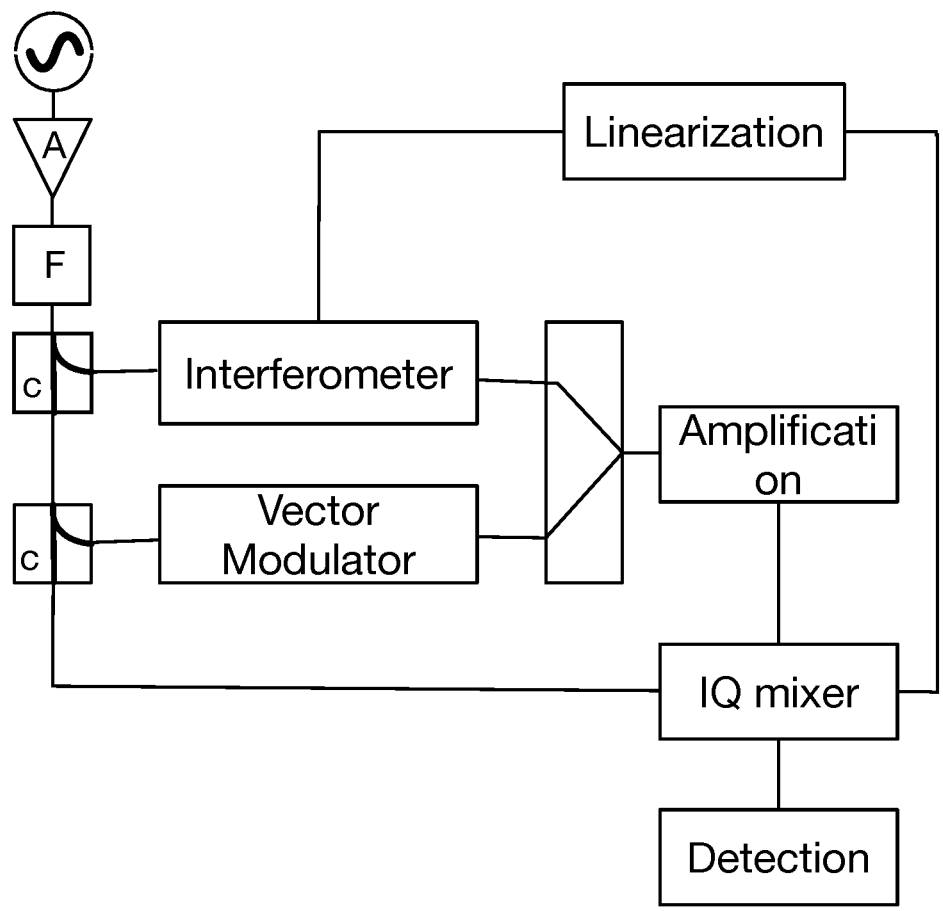
FIG. 31 is a schematic of a circuit representation of an interferometer system incorporating a linearization circuit.

In one large disparity example, as shown in FIG. 31, that may include large disparity in field strengths, the general application example may additionally include a linearization circuit. The large disparity example functions to precisely measure fields that may have a large disparity in magnitude. Although the general application example could function over a wide range, the large disparity example includes a feedback loop that may reduce non-linear effects due to the wide disparity of field magnitudes, thereby making field measurements more accurate.

3. Method

As shown in FIG. 32, a method for measuring electromagnetic (EM) field activity using a ferromagnetic resonance (FMR) multi-sensor circuit, includes: generating an electrical signal S110; splitting the current S120 into a test signal and a reference signal; at each ferromagnetic sensor, applying the EM field to the test signal S130, thereby modifying the test signal; and measuring the EM field S140 by comparing the modified test signal to the reference signal. The method functions to measure an applied to EM field in a specific region using an FMR sensor device, particularly an acoustically driven ferromagnetic resistance (ADFMR) sensor device. The device may be the systems as described above, but may alternatively comprise any applicable system comprising FMR sensors.

Block S110, which includes generating an electrical signal S110, functions to activate and power the multi-sensor circuit. Generating an electric signal S110 includes creating a radio frequency (RF) signal with a given center frequency and bandwidth. In some variations, signal may change over time, while in other variations the signal is fixed. As ADFMR sensors are activated by electric signals they are in resonance with, generating a signal S110 may specifically generate signals that are resonant with the ADFMR sensors. Generating a signal S110 may thus activate, or inactivate, ADFMR sensors by tuning to different frequencies.

In some variations, generating a signal S110 may generate a frequency comb. The frequency comb comprises a semi-discrete signal comprising a central frequency and incremental "discrete-like" frequency steps around the central frequency spanning up to a desired bandwidth of the signal. In preferred variations, the step increments are sufficiently large such that one specific frequency increment may activate a sensor component at resonance, while having no effect on other sensors. In this manner, sensor noise (i.e., cross-talk) may be reduced. Additionally, the frequency increments are chosen such that higher level harmonics generated by one frequency would not overlap with another desired frequency.

Block S120, which includes splitting the signal into a test signal and a reference signal, functions to take a single oscillating current and split it into two identically in phase, currents; heretofore referred to as a test signal and a reference signal. Splitting the current may enable comparison measurement between the test signal and the reference signal as either an interferometer or a gradiometer. For a gradiometer implementation, the reference signal may also be referred to as a second test signal. All method steps that refer, or apply, to the test signal will equally refer, or apply, to the second test signal.

Block S130, which includes, at each FMR sensor, applying the EM field to the test signal, functions to modify the test signal in response to the EM field strength and direction. In variations wherein block S130 is applied to an ADFMR sensor, block S130 further includes: in response to a resonant frequency RF signal, generating a surface acoustic wave (SAW), propagating the SAW across a ferromagnetic film thereby applying the EM field to the SAW, and converting an altered SAW to an altered test signal.

Generating a surface acoustic wave (SAW), functions to convert the test signal to a SAW. Generating a SAW further includes propagating the SAW along a ferromagnet and exciting the ferromagnet to resonance. In preferred variations, the test signal is converted to a radio frequency (RF) field that is then converted to a SAW by an input interdigitated transducer (IDT), but other methods may be implemented. In this preferred variation, the input IDT is preferably a component of an acoustically driven ferromagnetic resonance (ADFMR) device, which additionally includes a piezoelectric substrate base, an output IDT, and a ferromagnetic material along the piezoelectric substrate between the input IDT and output IDT. Generating a SAW preferably generates a SAW that with a frequency at, or close to, the resonance frequency of the ferromagnetic material. As the SAW travels propagates along the ferromagnet, the ferromagnet may become excited to resonance. This may cause the ferromagnet to become more susceptible to magnetic fields. Exposing the ferromagnet to a magnetic field, enables absorption of the magnetic field by the ferromagnet. Exposing the ferromagnet to a magnetic field may occur at any time; in fact, considering the earth's magnetic field this is technically always occurring. Once the ferromagnet is at or near resonance, exposing the ferromagnetic field enables the ferromagnetic to absorb the field. Absorbing the field preferably includes altering the propagating SAW. As the SAW propagates over the ferromagnetic, the SAW is altered, preferably proportional to the magnitude and direction of the field.

Converting the altered acoustic wave to an altered test signal, then enables measuring the field using the altered test signal. Converting the altered acoustic wave to an altered test signal, preferably occurs at an acoustic transducer. More preferably at an output IDT on the piezoelectric substrate.

As mentioned previously, the FMR sensor may only be activated if the electric signal is in resonance with the FMR sensor. As part of a multi-sensor circuit, the electric signal may thus be used to activate desired FMR sensors (by including the appropriate frequency band in the RF signal) while simultaneously having no effect on undesired FMR sensors. In preferably variations, the signal may thus be used to activate and inactivate sensors. This may lead to a reduction in cross-talk noise between sensors and improve power consumption. Additionally, for FMR sensors in parallel, a single electronic oscillator may thus be used to activate and deactivate sensors as desired.

Block S140, which includes measuring the EM field functions to measure desired information regarding the EM field by comparing the altered test signal to the unmodified reference signal. Measuring the EM field may occur at a detector. This is preferably accomplished by combining the altered test signal with the reference signal and utilizing interference to determine the field strength. In some preferred variations this utilizes destructive interference, measuring the field includes phase shifting the reference field half a period such that the reference signal and the original test signal cancel each other out.

In the alternative preferred variation, for measuring the field gradient, measuring the EM field S140 includes determining the difference in the field strength between the altered test signal and an altered second test signal which is spatially positioned at fixed displacements compared to the "first" test signal.

Measuring the EM field S140 may include converting the signal to a digital signal. Converting the signal to a test signal may have two variations: either converting the combined test and reference signal to a digital output signal; or converting the test signal to a digital reference signal, converting the reference signal to a digital reference signal, and combining the digital test signal and the digital reference signal.

4. System Architecture

The systems and methods of the embodiments can be embodied and/or implemented at least in part in connection with a computing system including at least one a machine configured to receive a computer-readable medium storing computer-readable instructions. The multi-array magnetic sensing component, particularly the ADFMR sensor device, and the enabled system and method above can be integrated within a computing system such that programmatic control of such a device may be used, wherein the computing system can make use of a sensor input providing EM field sensor data. The computing system can include one or more multi-array magnetic sensing enabled systems. The instructions can be executed by computer-executable components integrated with the application, applet, host, server, network, website, communication service, communication interface, hardware/firmware/software elements of a user computer or mobile device, wristband, smartphone, or any suitable combination thereof. Other systems and methods of the embodiment can be embodied and/or implemented at least in part as a machine configured to receive a computer-readable medium storing computer-readable instructions. The instructions can be executed by computer-executable components integrated with apparatuses and networks of the type described above. The computer-readable medium can be stored on any suitable computer readable media such as RAMs, ROMs, flash memory, EEPROMs, optical devices (CD or DVD), hard drives, floppy drives, or any suitable device. The computer-executable component can be a processor but any suitable dedicated hardware device can (alternatively or additionally) execute the instructions.

In one variation, a system comprising of one or more computer-readable mediums storing instructions that, when executed by the one or more computer processors, cause a computing platform to perform operations comprising those of the system or method described herein such as: generating an electrical signal; converting the electrical signal to an acoustic wave; propagating the acoustic wave across a magnetic material; converting the altered acoustic wave to an altered electrical signal; and measuring the field.

In one variation, a non-transitory computer-readable medium storing instructions that, when executed by one or more computer processors of a computing platform, can cause the computing platform to perform operations of the system or method described herein such as: operating in a low power mode; switching to a low power operating mode; switching to a fully active operating mode; operating in an active noise reduction mode; operating in a spatial averaging mode; operating in an optimization mode; and operating in a calibration mode.

In a second variation, a non-transitory computer-readable medium storing instructions that, when executed by one or more computer processors of a computing platform, can cause the computing platform to perform operations of the system or method described herein such as: generating an electrical signal; converting the electrical signal to an acoustic wave; splitting the current into a test signal and a reference signal; applying the EM field to the test signal; and measuring the EM field.

Figure 34:
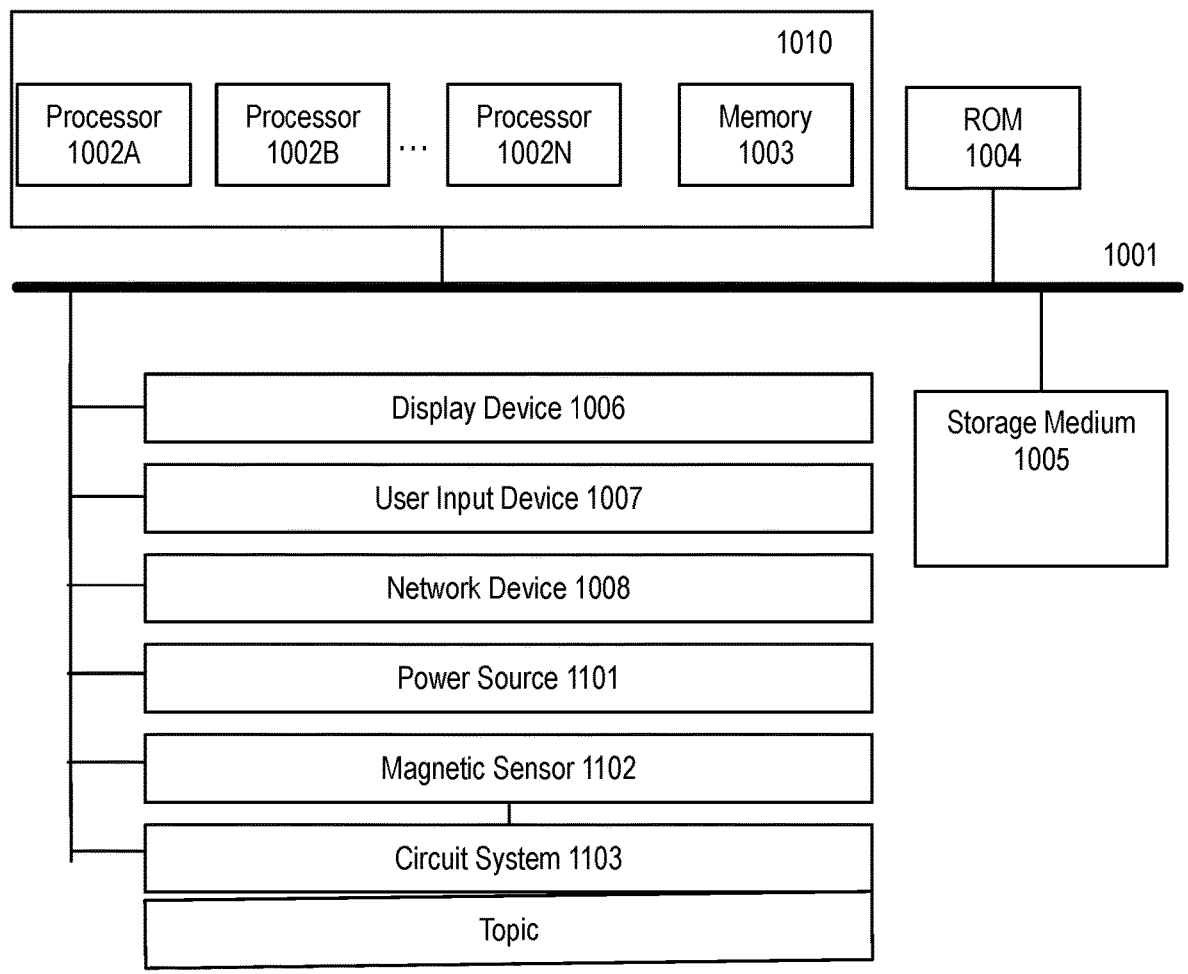
FIG. 34 is an exemplary system architecture that may be used in implementing the system and/or method.

FIG. 34 is an exemplary computer architecture diagram of one implementation of the system. In some implementations, the system is implemented in a plurality of devices in communication over a communication channel and/or network. In some implementations, the elements of the system are implemented in separate computing devices. In some implementations, two or more of the system elements are implemented in same devices. The system and portions of the system may be integrated into a computing device or system that can serve as or within the system.

The communication channel 1001 interfaces with the processors 1002A-1002N, the memory (e.g., a random-access memory (RAM)) 1003, a read only memory (ROM) 1004, a processor-readable storage medium 1005, a display device 1006, a user input device 1007, and a network device 1008. As shown, the computer infrastructure may be used in connecting a power source 1101, a set of magnetic sensors (e.g., a magnetic sensor 1102), a circuit system 1103, and/or other suitable computing devices. Alternatively, the system described above may be enabled as a self-contained system that is connected to the computer infrastructure.

The processors 1002A-1002N may take many forms, such CPUs (Central Processing Units), GPUs (Graphical Processing Units), microprocessors, ML/DL (Machine Learning/Deep Learning) processing units such as a Tensor Processing Unit, FPGA (Field Programmable Gate Arrays, custom processors, and/or any suitable type of processor.

The processors 1002A-1002N and the main memory 1003 (or some sub-combination) can form a processing unit 1010. In some embodiments, the processing unit includes one or more processors communicatively coupled to one or more of a RAM, ROM, and machine-readable storage medium; the one or more processors of the processing unit receive instructions stored by the one or more of a RAM, ROM, and machine-readable storage medium via a bus; and the one or more processors execute the received instructions. In some embodiments, the processing unit is an ASIC (Application-Specific Integrated Circuit). In some embodiments, the processing unit is a SoC (System-on-Chip). In some embodiments, the processing unit includes one or more of the elements of the system.

A network device 1008 may provide one or more wired or wireless interfaces for exchanging data and commands between the system and/or other devices, such as devices of external systems. Such wired and wireless interfaces include, for example, a universal serial bus (USB) interface, Bluetooth interface, Wi-Fi interface, Ethernet interface, near field communication (NFC) interface, and the like.

Computer and/or Machine-readable executable instructions comprising of configuration for software programs (such as an operating system, application programs, and device drivers) can be stored in the memory 1003 from the processor-readable storage medium 1005, the ROM 1004 or any other data storage system.

When executed by one or more computer processors, the respective machine-executable instructions may be accessed by at least one of processors 1002A-1002N (of a processing unit 1010) via the communication channel 1001, and then executed by at least one of processors 1001A-1001N. Data, databases, data records or other stored forms data created or used by the software programs can also be stored in the memory 1003, and such data is accessed by at least one of processors 1002A-1002N during execution of the machine-executable instructions of the software programs.

The processor-readable storage medium 1005 is one of (or a combination of two or more of) a hard drive, a flash drive, a DVD, a CD, an optical disk, a floppy disk, a flash storage, a solid state drive, a ROM, an EEPROM, an electronic circuit, a semiconductor memory device, and the like. The processor-readable storage medium 1005 can include an operating system, software programs, device drivers, and/or other suitable sub-systems or software.

As used herein, first, second, third, etc. are used to characterize and distinguish various elements, components, regions, layers and/or sections. These elements, components, regions, layers and/or sections should not be limited by these terms. Use of numerical terms may be used to distinguish one element, component, region, layer and/or section from another element, component, region, layer and/or section. Use of such numerical terms does not imply a sequence or order unless clearly indicated by the context. Such numerical references may be used interchangeable without departing from the teaching of the embodiments and variations herein.

As a person skilled in the art will recognize from the previous detailed description and from the figures and claims, modifications and changes can be made to the embodiments of the invention without departing from the scope of this invention as defined in the following claims.

We claim:

1. A system for a multi-array magnetic sensing component comprising:
   a circuit base platform;
   a set of magnetic sensors arranged on the circuit base platform; and
   a circuit system comprising a signal input and a signal output,
   the signal input being an electrical oscillator signal input and being connected to each magnetic sensor in the set of magnetic sensors,
   the signal output including magnetic field measurements from the set of magnetic sensors, wherein each magnetic field measurement is individually outputted,
   the circuit system being configured to turn on or off subsets of the set of magnetic sensors, and
   wherein the set of magnetic sensors includes a frequency multiplexed subset of magnetic sensors such that the signal input directed to each magnetic sensor, from the frequency multiplexed subset, is at a distinct frequency bandwidth such that the signal output from each magnetic sensor from the frequency multiplexed subset is identifiable by an associated frequency.

2. The system of claim 1, wherein the set of magnetic sensors comprise a set of acoustically driven ferromagnetic resonance (ADFMR) sensor devices.

3. The system of claim 1, wherein the set of magnetic sensors includes a time multiplexed subset of magnetic sensors, such that the signal input directed to each magnetic sensor, from the time multiplexed subset, is generated over distinct time intervals; such that the signal output from each magnetic sensor, from the time multiplexed subset, is identifiable by an associated time interval.

4. The system of claim 3, wherein the signal input time intervals for each magnetic sensor comprise non-overlapping time intervals, such that the signal input to one magnetic sensor from the time subset does not occur simultaneously with the signal input to another magnetic sensor from the time subset, such that signal output from each magnetic sensor, from the time subset, is identifiable as the only signal output at a given time.

5. The system of claim 3, wherein the distinct time interval signal input comprises a distinct time pattern of multiple active and inactive time intervals; such that the signal output for each magnetic sensor, from the time subset, is identifiable by its distinct time pattern.

6. The system of claim 1, wherein the system is configured to operate at a low power operating mode, wherein only a fraction of the magnetic sensors, from the set of magnetic sensors, are operating continuously.

7. The system of claim 6, in response to a trigger signal, the system is configured to switch from a low power operating mode to an active operating mode, wherein all magnetic sensors, from the set of magnetic sensors, start functioning.

8. The system of claim 7, wherein the system is configured to switch to a low power operating mode once a second trigger signal is received.

9. The system of claim 8, wherein the second trigger signal is when sensor activity from the set of magnetic sensors falls below a threshold.

10. The system of claim 1, further comprising a high permeability material encircling the set of magnetic sensors.

11. The system of claim 1, further comprising a field coil, situated near or around the set of magnetic sensors; and where in a shielding operating mode, the field coil generates a magnetic field to cancel out environmental fields in proximity of the set of magnetic sensors.

12. The system of claim 11, in a calibration operating mode, the field coil generates a magnetic field to shift field measurements made by the set of magnetic sensors to a linear regime.

13. The system of claim 1, wherein the set of magnetic sensors are arranged in a two-dimensional hypersurface arrangement on the circuit base platform.

14. The system of claim 1, wherein the circuit base platform comprises an integrated circuit (IC), such that the set of magnetic sensors are situated on the IC.

15. The system of claim 1, wherein the circuit base platform comprises a printed circuit board (PCB), such that the set of magnetic sensors are situated on the PCB.

16. The system of claim 15, wherein subsets of magnetic sensors from the set of magnetic sensors are situated on integrated circuits (ICs) and the ICs are situated on the PCB.

17. The system of claim 1, wherein the signal input is connected to each magnetic sensor through intermediary circuitry.

18. A system for a multi-array magnetic sensing component comprising:
a circuit base platform;
a set of acoustically driven ferromagnetic resonance (ADFMR) sensor devices arranged on the circuit base platform; and
a circuit system comprising signal input, and a signal output,
the signal input being an electrical oscillator signal input and being connected to each magnetic sensor in the set of magnetic sensors,
the signal output including magnetic field measurements from the set of magnetic sensors, wherein each magnetic field measurement is individually outputted,
the circuit system being configured to turn on or off subsets of the set of magnetic sensors, and
wherein the set of magnetic sensors includes a frequency multiplexed subset of magnetic sensors such that the signal input directed to each magnetic sensor, from the frequency multiplexed subset, is at a distinct frequency bandwidth such that the signal output from each magnetic sensor from the frequency multiplexed subset is identifiable by an associated frequency.

19. The system of claim 18, wherein the signal input is connected to each magnetic sensor through intermediary circuitry.

* * * * *